US008166430B2

(12) United States Patent
Bormann et al.

(10) Patent No.: US 8,166,430 B2
(45) **Date of Patent: *Apr. 24, 2012**

(54) METHOD FOR DETERMINING THE QUALITY OF A QUANTITY OF PROPERTIES, TO BE EMPLOYED FOR VERIFYING AND SPECIFYING CIRCUITS

(75) Inventors: Jörg Bormann, Pullach (DE); Holger Busch, Brunnthal (DE)

(73) Assignee: Onespin Solutions GmbH, Munich (DE)

( * ) Notice: Subject to any disclaimer, the term of this patent is extended or adjusted under 35 U.S.C. 154(b) by 182 days.

This patent is subject to a terminal disclaimer.

(21) Appl. No.: 12/488,672

(22) Filed: Jun. 22, 2009

(65) Prior Publication Data

US 2009/0327984 A1 Dec. 31, 2009

Related U.S. Application Data

(63) Continuation of application No. 11/459,433, filed on Jul. 24, 2006, now Pat. No. 7,571,398.

(30) Foreign Application Priority Data

Sep. 15, 2005 (EP) .................................... 05020124

(51) Int. Cl.
*G06F 17/50* (2006.01)
*G06F 17/15* (2006.01)

(52) U.S. Cl. ............ 716/106; 716/111; 716/136; 703/2; 703/16

(58) Field of Classification Search .................. 716/106, 716/111, 136; 703/2, 16
See application file for complete search history.

(56) References Cited

U.S. PATENT DOCUMENTS

| | | | |
|---|---|---|---|
| 5,065,335 | A | 11/1991 | Yokota et al. |
| 5,689,685 | A | 11/1997 | Feldmann et al. |
| 5,880,966 | A | 3/1999 | Hogan |

(Continued)

FOREIGN PATENT DOCUMENTS

| | | | |
|---|---|---|---|
| WO | 00/79421 | A2 | 12/2000 |

OTHER PUBLICATIONS

G. Feierbach and V. Gupta, "True Coverage: A Goal of Verification", Proceedings of the Fourth International Symposium on Quality Electronic Design (ISQED'03), Mar. 24-26, 2003, pp. 75-78.

(Continued)

*Primary Examiner* — Phallaka Kik
(74) *Attorney, Agent, or Firm* — 24IP Law Group; Timothy R. DeWitt

(57) ABSTRACT

A method is specified for determining the quality of a quantity of properties describing a machine, including a step for determining the existence of at least one sub-quantity of interrelated properties (P0, P1, . . . Pn) of the form Pi=(forall t. $A_i(t)$=>$Z_i(t)$), wherein $A_i(t)$ present an initial state and $Z_i(t)$ a target state for a corresponding property and at least one initial state $A_i$ is dependant on internal signals and including a step for checking whether at least one aspect of the input/output behavior of the machine described by the properties, which cannot be derived from an individual property $P_i$, is described to such an accurate extent that one property Q exists, which represents this aspect without being dependant on the internal signals. The procedure is capable of providing a measurement and can particularly be used in the verification and specification of circuits.

4 Claims, 8 Drawing Sheets

U.S. PATENT DOCUMENTS

| | | | | |
|---|---|---|---|---|
| 6,131,078 | A | 10/2000 | Plaisted | |
| 6,324,678 | B1 | 11/2001 | Dangelo et al. | |
| 6,530,065 | B1 | 3/2003 | McDonald et al. | |
| 6,594,804 | B1 | 7/2003 | Hojati | |
| 6,728,939 | B2 | 4/2004 | Johannsen | |
| 6,848,088 | B1 | 1/2005 | Levitt et al. | |
| 7,020,856 | B2 | 3/2006 | Singhal et al. | |
| 7,124,383 | B2 | 10/2006 | Chen et al. | |
| 7,159,198 | B1 | 1/2007 | Ip et al. | |
| 7,571,398 | B2 * | 8/2009 | Bormann et al. | 716/106 |
| 2005/0010882 | A1 | 1/2005 | Winkelmann et al. | |
| 2005/0114809 | A1 | 5/2005 | Lu | |
| 2005/0159835 | A1 | 7/2005 | Yamada et al. | |
| 2005/0183048 | A1 | 8/2005 | Kinzelbach | |
| 2006/0156261 | A1 | 7/2006 | Farkash et al. | |
| 2006/0161413 | A1 | 7/2006 | Wei et al. | |
| 2006/0212837 | A1 | 9/2006 | Prasad | |
| 2006/0225022 | A1 | 10/2006 | Ezaki | |

OTHER PUBLICATIONS

Frenkel, S., "Verification Model Structures for Digital Systems Design", source(s): mtu-net.ru.
Um, et al., "A Systematic Transaction-Level Modeling and Modeling and Verification", source(s): samsung.com (2006).
Regimbal, et al., "Automating Functional Coverage Analysis Based on an Executable Specification", 3rd IEEE Int'l Workshop on System-on-Chip for Real-Time Appl. (2003).
Ghosh, et al., "A Technique for Estimating the Difficulty of a Formal Verification Problem", Pro. of the 7th International Symposium on Quality Electronic Design (2006), Mar. 27-29, 2006.
Zhang, et al., "A Framework for Automatic Design Validation of RTL Circuits Using ATPG and Observability-Enhanced Tag Coverage", IEEE Trans. On Computer-Aided Design (2006) vol. 25, No. 11, Nov. 2006, pp. 2526-2538.
Byeong Min and Gwan Choi, "RTL Functional Verification Using Excitation and Observation Coverage", source(s): tamu.edu.
Grosse D. et al., "Acceleration of SAT-based iterative property checking", (2005).
Nimmer, J.W., "Static verification of 1-19 dynamically detected program invariants—Integrating Diakon and ESC/Java," Electronic Notes in Theoretical Computer Science, Elsevier, Bd. 55, Nr. 2, Oct. 2001.
Katz, et al., "Have I written enough Properties?", a Method of Comparison Between Specification and Implementation CHARME 99, LCNS 1703 (1999).
Drechsler et al., "Design Understanding by Automatic Property Generation" (2006).
Tasiran et al., "Coverage Metrics for Functional Validation of Hardware Designs," IEEE Design & Test of Computers, 2001, vol. 18, No. 4, pp. 36-45.
Biere et al., "Symbolic Model Checing Using SAT Procedures Instead of BDD's," Proc. of 36th Design Automation Conf., 1999.
Hoskote et al., "Coverage Estimation for Symbolic Model Checking," Proc. of 36th Design Automation Conf., 1999.
Burch et al., "Symbolic Model Checking for Sequential Circuit Verification," IEEE Transactions on Computer-Aided Design of Integrated Circuits and Systems, vol. 13, No. 4, 1994.
Chockler et al., "Coverage Metrics for Temporal Logic Model Checking," Hebrew University, School of Engineering and Computer Science, 1999, pp. 300-305.

* cited by examiner

METHOD FOR DETERMINING THE QUALITY OF A QUANTITY OF PROPERTIES, TO BE EMPLOYED FOR VERIFYING AND SPECIFYING CIRCUITS

The computer program listing appendix submitted with this application, which is contained in the file SN12488672Code.txt having 29 KB, created on Feb. 23, 2009, is incorporated by reference in its entirety.

CROSS-REFERENCE TO RELATED APPLICATIONS

The present application is a continuation of and claims the benefit of the filing of U.S. patent application Ser. No. 11/459,433, filed on Jul. 24, 2006, now U.S. Pat. No. 7,571,398, which claims the benefit of the filing date of European Patent Application EP 05 020 124.3, filed on Sep. 15, 2005, both of which are hereby incorporated by reference in their entirety.

BACKGROUND OF THE INVENTION

The present invention generally relates to a procedure for determining the quality of a quantity of properties describing a machine. The machine of the type under consideration can be both software and hardware. Within the meaning of this application a machine is suitable to be described by means of properties. Such properties are generally known to the person skilled in the art of functional verification of digital circuits. An exemplary machine is thus a digital circuit.

When performing functional verification, an RTL-description of a circuit is verified as to whether it will function properly. The quality of the RTL-description after functional verification is decisive for the success of a circuit design project. Remaining errors are likely to cause high costs, loss of time and reputation.

In addition, using simulation as the principal work horse in functional verification is standard. For this, input patterns are preset, either automatically or by the user, and the output patterns generated by simulation compared with expectations. Errors are detected if an output pattern does not meet with expectations. Automatic mechanisms for error detection in simulation are hereinafter called monitors.

In order to detect an error, there must be given a suitable input pattern for which the simulation produces an output pattern in which the error shows up. Even in small circuits the quantity of all possible input patterns is very large. In addition, the factor between the run time in the real circuit and its simulation is in the range of $10^6$. Therefore only a few input patterns can be simulated in comparison with the total number, so that many functional errors remain undetected.

Increasingly so-called property checkers are used for functional verification. Property checkers are given, as something input something called a “property”, i.e. a relationship concerning certain aspects of the circuit, that is described in a formal language. Within surprisingly short time, the property checker yields a result in the form of either the information that the property has been proven by the property checker. In this case the relationship between the behavior aspects which is described in the property will always occur, irrespective of how the circuit is operated a rebuttal in which an input pattern for the circuit is described that violates the relationship between the behaviour aspects. This rebuttal is generated by the property checker.

The automatic generation of counter-examples and the rapid checking of the property for all possible input patterns constitute a considerable advancement in the functional verification vis-à-vis simulation.

For this reason, property checkers are also being implemented today by innovative verification groups. However, they only verify selectively as behavioural associations that are considered critical, which were chosen by a verification engineer based on his/her intuition and experience. This nonetheless only enables gradual improvements in the quality of the RTL description after verification. A relatively high number of errors in the design are still present in the result.

In the area of circuit verification by means of simulation, suggestions have already been made concerning procedures for the evaluation of the quality of the verification environment, which even calculate measures, which are supposed to be related to this quality. In this sense, the number and coverage of the input patterns used for simulation is, on the one hand, of the greatest importance for the quality of the verification environment and, on the other hand, the effort to achieve a multiplicity of different types of input patterns is also cause for a large resource requirement.

The corresponding procedures have already been in use for years and are supported by commercial EDG tools (see e.g. D. Dempster, M. Stuart: “Verification Methodology Manual—Techniques for Verifying HDL Designs”, Teamwork International, 2nd edition, 2001; and S. Tarisan, K. Keutzer: “Coverage Metrics for Functional Validation of Hardware Designs”, IEEE Design & Test of Computers. 2001.) The metrics for determining the measures are often code-based such as the line coverage, path coverage, assignment coverage and coverage of states for explicit state machines from the RTL code.

Such methods for measuring the quality of a verification were first developed for software verification. Unlike sequential software, however, hardware operates in the form of parallel processes. The dependencies generated by this are therefore not taken into account by the methods, so that the resulting quality measures are not reliable. Therefore, alternative measures have been suggested, for example those based on signals and require, for example, the assignment of all possible values. In addition, there are functional metrics, which display how often a certain functionality has been executed.

An inherent weakness in all of these approaches exists, however, in that attaining a level of 100% is far from securing the entire verification of all functionality. On the one hand, these approaches already achieve 100% coverage even when not all functionality and consequently all possible error sources in the circuit tested have been injected; on the other hand, there is no systematic test which shows whether the verification environment is capable of actually identifying every error that shows up.

The property check is described in exemplary terms in: A. Biere, A. Cimatti, M. Fujita, Y. Zhu: “Symbolic Model Checking using SAT procedures instead of BDDs” Proc. of 36th Design Automation Conference, 1999; and in: “Formale Verifikation für Nicht-Formalisten (Formal Verification for Non-Formalists)”, Bormann, J. and Spalinger, C: (2001), Informationstechnik und Technische Informatik, Vol. 43, Issue January 2001, Oldenburg Verlag.

When performing the quality assurance of a verification environment based on the property check, the issue is not necessarily the multiplicity and diversity of the input patterns, since a property checker functions as if it were inspecting all input patterns. It is rather the integrity of the property set, that is, whether each error in the circuit is detected when proving at least one of the properties.

Papers in this field are documented, for example, in: Hojati, R.: “Determining Verification Coverage Using Circuit Properties” U.S. Pat. No. 6,594,804, granted Jul. 15, 2003; Hoskote, Kam, Ho, and Zhao: "Coverage Estimation for Symbolic Model Checking" Proc. of 36th Design Automation Conference, 1999; and in: Hoskote, Y. "Property Coverage in Formal Verification", Patent WO200079421-A2. These approaches are all based on sequentially injecting errors in the circuit and then checking whether at least one of the properties is disproved by the property checker in the circuit that has been modified in this way. If each of the errors injected ends up being disproved, the quality of the property set will be designated as sufficiently high. Otherwise, a measure concerning the proportion of those injected errors will be determined which were detected by the property set.

With the known procedures, it is either injected as an error that signals are inverted in various achievable states or the gate, at whose output the signal to be covered is picked up, is changed on the net list.

These procedures are heuristic. There is no guarantee that errors other than those injected will be detected by the property set. In addition to the quantity of properties, the procedures also require the circuit description.

Task

Since so far the properties, as described above, have only been applied in a selective manner and based on experience, a need exists for a procedure, which can reliably specify the quality of a quantity of properties in a reproducible manner, particularly in the form of a measure which can then be brought into accordance with a target value by expanding or adjusting the volume.

Furthermore, a need exists for procedures for more reliable verification and the specification of circuits based on the reproducible quality of a quantity of properties.

Consequently, one object of the invention in question is to specify procedures which determine and utilize the quality of a quantity of properties describing a machine without having to resort to excessive use of resources or experience values.

SUMMARY OF INVENTION

The above tasks are fulfilled by the invention by means of the procedures of the independent claim, preferred exemplary embodiments constituting the subject matter of dependent claims. By means of determining the quality of a quantity of properties describing a machine it is possible to utilize the properties in a more efficient manner.

In particular, the invention suggests a method for determining the quality of a quantity of properties describing a machine, comprising the determination of the existence of at least one sub-set of interrelated properties ($P_0, P_1, \ldots P_n$); and the verification as to whether, by the interaction of ($P_0, P_1, \ldots P_n$), for at least one input pattern of the machine, the value of a given term Q(t) is unambiguously/uniquely determined at least at one point in time at which it is not unambiguously/uniquely determined by the observation of the individual properties, Q(t) being only dependent on values of input and output parameters at points in time relative to t.

Here, Q(t) can be specified by the user or drawn from a reference table such as the list of the output parameters for the machine.

Q(t) is assumed as unambiguously/uniquely determined a the quantity of properties in an input pattern at a point in time T if for two sequences of value, on the output and internal parameters which supplement the input pattern in such a way that all properties of the quantity on it are valid, the value of Q(T) on the one supplement is equal to the value of Q(T) on the other supplement.

It is typical for the property check that the individual properties do not clearly determine an output parameter and consequently no Q(t) value since the properties are often in the form for all t:

```
((Condition 1 for values of internal parameters at the point in time t) and
(Condition for input values at the point in time t) and
(Condition for input values at the point in time t+1) and
(Condition for input values at the point in time t+2) and
... and
(Condition for input values at the point in time t+n))
=>
((Output parameters have definite values at the point in time t) and
(Output parameters have definite values at the point in time t+1) and
... and
(Output parameters have definite values at the point in time t+n) and
(Condition 2 for internal parameters at the point in time t+n)
```

For this, the symbol => stands for the logical implication. The property itself does not determine any output parameters clearly because the complements to an input pattern can always be selected such that they violate condition 1 and then the values of the output parameters are able to be selected entirely contrary to one another. This type of complements completes the property and shows that no output value has been unambiguously/uniquely determined. The output values would be unambiguously/uniquely determined for an input pattern by the above property, if it is combined with a reset property, which ensures that the assignment of the internal signals following the activation of the reset input fulfils condition 1.

As such, the invention is based on checking whether individual properties, which are only utilized and considered on a singular basis pursuant to the state of the art, exist in relation to one another.

Using this basic concept, properties can be systematically identified and utilized and for example, can also form multiple series of properties, which constitute a statement independent of internal signals concerning the input/output behaviour of the machine over a longer period of time.

In accordance with a preferred exemplary embodiment, the interrelated properties form a series of properties, which starts with a property that describes the initialization behaviour of the machine and constitutes a statement concerning the input/output behaviour of the machine or also of a circuit over a longer period of time, whereupon this statement is no longer dependant on internal signals.

Those properties not considered in the formation of the series of properties are conveniently reported to the user. In this process, it is possible to adjust the volume of properties in an efficient way or to complete them since either the property in question has been reformulated or a predecessor and/or successor property is to be provided for it.

If the properties have the form $P_i$=forall t: $A_i$=>$Z_i$(t) with implicatively associated Boolean expressions $A_i$ and $Z_i$, which depend on values from the input, output and internal parameters at points in time relative to t, it can be conveniently checked during the determination step whether a series of reference points in time $T_1, T_2, \ldots T_n$ exists, such that the property given by the chaining of the properties with respect to the reference points in time $$
\begin{aligned}
E = & \text{ for all t. } (A_0(t) => Z_0(t)) \text{ and} \\
& ((A_0(t) \text{ and } A_1(T_1)) => Z_1(T_1)) \text{ and} \\
& ((A_0(t) \text{ and } A_1(T_1) \text{ and } A_2(T_2)) => Z_2(T_2)) \text{ and} \\
& \ldots\text{and} \\
& ((A_0(t) \text{ and } A_1(T_1) \text{ and } \ldots \text{ and } A_n(T_n)) => Z_n(T_n))
\end{aligned}
$$

already describes the input/output behaviour such that at least one input pattern, in which E clearly describes the value of Q(t) at a minimum of one point in time.

The procedure corresponding to the section "Automatic determining of all redundant specifications" proves this and the previous claims. For a quantity of properties, it is automatically determined, which properties are allowed to follow one another and how the reference points in time are to be formed during for this. Through this process, a graph is determined, whose only source is the property concerning the initializing behavior of the machine and whose finite paths, which start in the reset property, form the quantities or series of interrelated properties. Temporal domains, based on which the output signal is unambiguously/uniquely defined insofar the property is part of a series starting with the reset property and for which the reference points in time are selected in accordance with the values calculated, are calculated for every property and every output signal. Based on these temporal domains, it can then also be decided as to for which point in time Q(t) is unambiguously/uniquely defined.

The quantities of input patterns are conveniently described, on which Q(t) is unambiguously/uniquely determined for at least one point in time for each one.

If the properties are given in the implicative form described above, the quantity of input patterns, on which Q(t) is unambiguously/uniquely determined for at least one point in time for each one, consists of the input patterns for each of which a value series of the internal and output parameters is given such that there is at least one point in time t, for which the following applies based on these value series $A_0(t)$ and $Z_0(t)$ and $A_1(T_1)$ and $Z_1(T_1)$ and . . . and $A_n(T_n)$.

In general, the reference points in time are dependant on t and on values of the input parameters at points in time relative to t. It is beneficial, however, if the reference points in time are only dependant on t.

The interrelated properties are arranged preferentially in a sequential relation, whereupon the values based on the output and internal signals, which are able to fulfill $Z_{i-1}(t)$ for the suitable selection of the input pattern especially for $i \neq 0$, are also able to fulfill the Boolean expression $A_i(t')$ for a suitable input series and for a point in time t'. This condition is also utilized in the procedure corresponding to the section "Automatic determining of all redundant specifications".

The condition is closely related to the condition that $A_i(t)$ and $Z_{i-1}(t)$ except for temporal displacement contain syntactically equal partial expressions concerning output and internal parameters.

By means of a sequential relation, which ensures between the elements of a finite quantity of properties that a series of properties can always be extended, it is possible to also check time ranges on an input pattern of unlimited length and to make statements for which points in time Q(t) is unambiguously/uniquely defined. In particular, it can determined that Q(t) on an input pattern is unambiguously/uniquely determined for all points in time following the first point in time.

The procedure according to the section "Calculation of all redundant specifications" sets the foundation by setting a graph whose finite paths set all series of properties possible.

In order to be able to identify additional sub-quantities, the step of identifying the existence of at least one sub-quantity of interrelated properties is repeated. By means of this process, it is e.g. possible to determine all possible property chains based on the properties.

The check preferred is whether the output parameters of the machine are unambiguously/uniquely determined for all input patterns and for all output parameters of a machine and for all points in time following the first point in time. This claim is proven by the combination of the procedure from the section "Automatic determination of all redundant specifications" together with the procedure for determining the completeness of a set of properties that is revealed in this patent specification.

A value measurement is identified and issued on a preferential basis, which corresponds to the probability that the value of this output parameter is unambiguously/uniquely determined at this point in time by the property for any input pattern starting with the circuit for any point in time and for any output parameter. This claim is proven by the combination of the procedure from the section "Automatic determination of all redundant specifications" together with the procedure revealed in this patent specification that is used to calculate the measure of completeness.

The invention also proposes a procedure for the functional verification of digital circuits, in which the circuit is checked using a quantity of properties whose value was determined as described previously and corresponds to a defined designation. In terms of the defined designation, a set threshold value may be involved or a value specified by the user, for which the value is believed to be sufficient because e.g. a further improvement can only be achieved by means of a disproportionate extra amount of work. The value can be monitored during the successive development of the properties and inferences can be made regarding the work to be incurred based on the difference between the designated value and the actual value.

The invention also proposes a procedure for the specification of digital circuits, in which the specification is created, based on a quantity of properties whose value was determined as described previously and corresponds to a defined designation. The value can be monitored during the successive development of the properties and inferences can be made regarding the work to be incurred based on the difference between the designated value and the actual value.

The invention proposes a procedure for the simulative verification of digital circuits, in which monitors are utilized, whereupon the monitors represent machines and the quality of the monitors is determined using the value of a quantity of properties described for the monitor. This quantity of properties is determined as previously described. In this manner, the quality of the monitor can be systematically tracked.

Finally, the invention proposes a procedure for the simulative verification of digital circuits, in which the coverage is determined by monitors, which are acquired from the assumptions of a set of properties whose value was determined pursuant to a procedure of the claims and which correspond to a defined designation. In this way, it can particularly be ensured that the coverage is derived from a complete set of properties, thereby expressing functional aspects on the one hand and on the other hand, covering the entire functionality of a module. This coverage therefore combines the suitability of the functional coverage with the breadth of the coverage of code-based coverage and is thereby particularly suited for the system simulation.

In summary, the invention therefore enables checking a quantity of properties in terms of whether they cover the entire function of the circuit to be checked rather than only covering critical behavioural associations on a punctual basis. If the properties have all been proven on the machine (e.g. software or circuit) by a property checker, only errors also existent in the properties remain uncovered. The main problem of the simulation that errors remain undetected because they do not occur in any of the output patterns generated is avoided. As a result, the quality, which has the RTL description after completion of the verification, increases. As such, the invention allows a circuit verification to be conducted exclusively using a property check for the first time.

The fact that the mechanisms for the detection of errors (that is, the monitors or properties) could themselves be flawed and conceal circuit errors as a result thereof is a characteristic of every functional verification. This problem also exists in the simulation, which is recorded therein that the monitors have not detected any errors although they occur in an output pattern. If that happens, the monitor responsible for this was either coded incompletely, that is, it fails to conduct any check at all in one of the situations generated by the simulation or the monitor actually expects an incorrect value.

It can be ensured in an invention-pursuant manner that the properties check this behaviour at any point in time. Incompleteness in the properties is therefore automatically identified. As a result, errors that would otherwise remain undetected due to the incompleteness of the verification environment are also avoided.

In this context, it should be noted that the invention is not limited, in terms of its use, to the vicinity of a property checker. It can also identify incompleteness in monitors. For this, the monitors must be generated from properties, which were appropriately checked. The generation of monitors from properties is familiar to professionals. Procedures for the quality assurance of monitors to date are only known in terms of code review and recycling up to now, which however is not comparable with the invention-pursuant approach.

The properties commonly describe the machine or circuit behaviour to a more abstract extent than the RTL description. They mostly describe the machine resp. circuit behaviour over several cycles such that the processes in a machine/a circuit are presented universally and closed. As a result, they provide the verification engineer with a larger overview than the RTL description such that additional errors in the properties are avoided. The invention checks whether a quantity of properties has the quality of a machine/circuit description at a greater level of abstraction.

With the state-of-the-art vis-à-vis the simulation, the analysis of certain conditions with the objective of analyzing the number and variety of the input patterns simulated and consequently the probability that the flawed machine/circuit components were indeed conducted (coverage) is to be evaluated. The conditions implemented for this are commonly oriented with the text of the machine/circuit description. In this case, conditions are being worked with, which are fulfilled by the completion of a line (or also only one part of the line) in the machine/circuit description. This approach has the advantage that these kind of conditions consider each component of the machine respectively circuit in a wide-reaching manner. It is, however, regarded as inadequate because it does not take the parallel design of machine/circuit components into consideration. As a result, the text-oriented conditions are supplemented by conditions, which are fulfilled in specific partial processes (functional coverage). Nowadays, these kinds of conditions are only defined on a punctual basis, where they are necessary according to the intuition and experience of the verification engineer. The invention allows the definition of a set of such conditions, which are each fulfilled, if individual properties describe the machine/circuit behaviour. Such a set of conditions considers on the one hand all machine/circuit components and on the other also their parallel design. No procedures are yet known, with which sets of conditions of comparable quality can be generated.

All this helps keep the number of errors remaining in a design at a much lower level following the completion of a verification that utilizes said invention than following a simulation-based verification. Through the efficiency of the property checker, such verification most often saves an incredible amount of work.

In so doing, the invention delivers a specific criterion for the completion of the verification using the property checker in a preferred manner. If a property set is complete or suffices for the target value, the verification will end, if this is not the case, then it must be continued. The procedures corresponding to the state-of-the-art are not familiar with such criteria. In this case, the verification will be continued until the time or financial budget has been consumed or until certain specifications have been fulfilled, which heuristically suggest that now the residual risk has dropped below a tolerable value.

The invention can also be applied even before a set of properties has been verified with a property checker vis-à-vis a machine respectively circuit. This becomes important when such a set of properties is intended to play the role of a specification. Therefore, the invention is able to provide a necessary condition for the quality of a specification. This condition is not sufficient: There are sets of properties, which can be designated as being complete, although no circuit is present, which fulfil all the properties of such a property set.

For the purpose of control, the invention delivers a measure of completeness on a preferred basis, which allows the progress of the verification to be presented during the course of the project. This measurement increases in correlation to a growing number of properties and only returns the value 1 once the number of properties is complete. By means of this, the verification can be monitored much more precisely using a property checker than with all other procedures known to present.

Additional advantages and features of the invention and a detailed understanding can be obtained from the following description of the current execution forms preferred at this point in time, whereupon the description is intended to be purely illustrative and should not be regarded as being of a limiting nature. In this description, reference will be made to the attached diagrams, for which the following applies:

BRIEF DESCRIPTION OF THE DRAWINGS

In this description, reference will be made to the attached diagrams, for which the following applies.

DETAILED DESCRIPTION OF THE INVENTION

Figure 1:
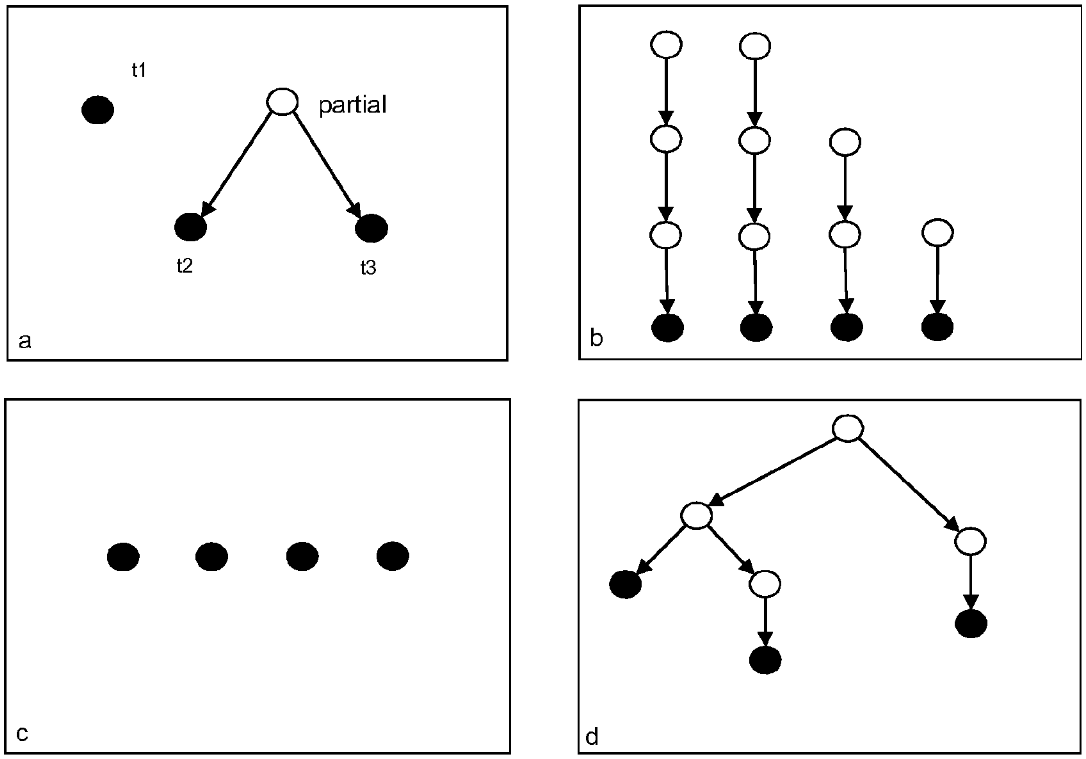
FIG. 1 describes some examples for partial property graphs.

The examples refer to circuits as one of the possible machines and are subsequently presented in the temporal language ITL. However, the invention is neither limited to this temporal logic nor to circuits. The procedures can also be completed using all other linear, temporal logics such as LTL, PSL or SVA and also be applied to software and other machines. The procedures described can be implemented both in terms of hardware and software.

The temporal logic is used for the description of the relationship between behavioural aspects in the properties. In the following representation, a slight modification of the ITL language, the input language of a property checker [it+ti] will be used. In this language, temporal aspects are described by referring to reference to points in time. Points in time correspond to cycles in synchronous digital circuits.

The core of ITL is comprised of logical lines of one of the following three forms at <point in time>:<Boolean condition>;

during [<point in time$_1$>, <point in time$_2$>]:<Boolean condition>;

within [<point in time$_1$>, <point in time$_2$>]:<Boolean condition>;

The first form requires the validity of the Boolean condition at the point in time specified, the second for all points in time in the interval and the third for at least one point in time in the interval. If the interval is empty, the second form is fulfilled trivially and the third is not fulfilled trivially.

The analysis of a Boolean condition at a specific point in time T for all standard operators occurs through analysis of partial expressions at this point in time T until a partial expression is issued by means of a signal, whose value is then implemented at the point in time T. Term at the point in time T+n respectively T−n is evaluated in order to evaluate a partial expression of the form next(Term, n) or prev(Term, n). In order to evaluate a partial expression of the form Term @ T', term at the point in time T' is evaluated.

Points in time are specified relative to a point in time t of choice, but one that is fixed or relative to temporal variables that have been derived from it, which are for their part to be declared again relative to t. As such, it should be expressed that at any point in time a property of a conceived, unlimited simulation session should be checked.

Temporal variables are declared by means of a list of expressions $$T_1 = B_1 + n_1 .. m_1,\quad T_2 = B_2 + n_2 .. m_2,\quad ....;$$

For this, the $B_i$ describe either t or another temporal variable $T_j$ declared in the above list and are called basis temporal variables of $T_i$. A permitted allocation of the temporal variables must fulfil the conditions given above, that is $B_i+n_i<=T_i<=B_i+m_i$ must be true. Temporal variables are generally used in order to describe how the observed circuit synchronizes with its environment. For this, signal edges are frequently utilized in the assumption by means of conditions in the form

```
during [B_i + n_1,T_i - 1]: signal /= value;
at      T_i:                signal = value;
```

in order to set a temporal value $T_i$. These conditions are referred to as localization conditions.

Logical lines form conditions as follows: In the simplest of cases, a condition represents a logical line. The succession of two conditions corresponds to their conjunction.

Disjunction is expressed by

```
either
<condition 1>;
or      <condition 2>;
or      ...
end either;
```

Temporal-logical operators between the conditions are also used unless this condition is not to be directly proven using a property checker.

A property has the form

```
theorem <name>;
for timevars: <temporal variable declaration>;
assume:
<condition 1>;
prove:
<condition 2>;
end theorem;
```

Condition 1 is to be referred to as assumption, condition 2 as the proof. The property is fulfilled, if the affirmation also applies to each permitted allocation of t and all temporal variables, for which the assumption is fulfilled. Vice versa, a counter example for the property is represented by a process, in which any permitted allocation of t and the temporal variables has been fulfilled for the assumption, but not the proof.

Partial expressions up to conditions can be summarized in macros, which can be parameterized if necessary.

The shortest interval [t−n, t+m] where n, m>=0 is herein referred to as the inspection window such that any point in time, at which any signal is evaluated, lies between t−n and t+m for any allocation of the temporal values.

t_first and t_last should describe the inspection window that results when all logical lines are replaced by at t: true, which for their part reference t_first or t_last.

Two synchronous digital circuits are to exist with a reset input. A similarity is assumed when both circuits produce the same output patterns following collective resetting to the same input patterns.

A quantity of properties is viewed to be complete when any two circuits, each of which fulfilling of all properties of this quantity, are similar to one another.

The completeness checker inspects properties of a specific type referred to as operation properties. First of all, the theory for the properties is presented, which are strictly limited in relation to their expressiveness. Afterwards, generalization occurs based on this more demonstrative representation.

Properties arising from the following basic form shall be assumed:

```
theorem basic form;
assume:
at    t:     Initial state(<internal signals>);
at    t:     Trigger_0(<input signals>);
at    t+1:     Trigger_1(<input signals>);
at    t+2:          Trigger_2(<input signals>);
prove:
at    t:     Output description_0(<output signals>);
at    t+1:      Output description_1(<output signals>);
at    t+2:      Output description_2(<output signals>);
at    t+3:      Output description_3(<output signals>);
at    t+4:      Output description_4(<output signals>);
...
at    t+n:      Output description_n(<output signals>);
at  t+n:     final state(<internal signals>);
end theorem;
```

For this, initial state, $trigger_i$, output $description_i$ and final state are all to be considered as macros. The property essentially describes: "If the circuit is in a certain state, which is described by the macro initial state and if it recognizes the input patterns, which are described by the macro's $trigger_i$, then it will return an output $description_i$ and proceed to the final state".

The basic idea behind these properties is to form chains composed of chain links. The chain links have ends, which each correspond to the initial and final state of a property in the above form. Under certain circumstances, one can form chains from properties in a corresponding manner. An objective of the invention is, by means of local inspection of a limited number of properties, to ensure that an unlimited chain of properties can be formed for every possible unlimited input pattern through the stacking of start and end states that correspond to one another and whose trigger is fulfilled by the input pattern and whose output descriptions clearly and completely describe the output pattern.

This is formalized as follows:

A logical expression P is designated to be dependent on a parameter s, if an allocation of the remaining syntactic parameters occurring in P exists such that the value P can be made true or false through the different selection of a value for s.

Given that a series of properties $P_0$, $P_1$, $P_2$, . . . $P_n$ of properties of the form $P_i$=for all t exists: $a_i(t)$=>$z_i(t)$, with implicatively associated Boolean expressions $a_i(t)$ and $z_i(t)$, which are dependant on values of the input, output and internal parameters of a machine at points in time relative to t and a series of reference points in time $T_1$, $T_2$, . . . , $T_n$, which may be dependant on t and values of the input parameters relative to t. We designate the following as an applicable property for all t: ($a_0(t)$=>$z_0(t)$) and (($a_0(t)$ and $a_1(T_1(t))$)=>$z_1(T_1(t))$) and ($a_0(t)$ and $a_1(T_1(t))$ and $a_2(T_2(t))$)=>$z_2(T_2(t))$) and . . . .

We describe the series $P_0$, $P_1$, $P_2$, . . . $P_n$ with reference points in time $T_1$, $T_2$, . . . $T_n$ as a chain when $P'_0$, $P'_1$, $P'_2$, . . . $P'_n$ exists in the form $$P'_i=\text{for all } t: a'_i(t)=>z_i(t),$$

whose $a'_i$ are only dependant on values based on input values relative to t and whose applicable property is equivalent to the property, which belongs to the output series. In a chain, it only depends on the input signals as to whether and at which site the behaviour of the output and internal signals is described by the $z_i$. With this requirement, the series $P_0$, $P_1$, $P_2$, . . . . $P_n$ with the reference points in time $T_1$, $T_2$, . . . , $T_n$, are trivially chains, if the $a_i$ are only dependant on input signals. But also one $a_i$, which is dependant on internal or output signals, can belong to a chain, if e.g. $z_{i-1}$ provides sufficient information concerning these signals. The manner in which this can be tested is part of the invention described in this text.

An internal or output signal s is, with respect to a chain $P_0$, $P_1$, $P_2$, . . . . $P_n$ featuring reference points in time $T_1$, $T_2$, . . . $T_n$, determined at a point in time Z, which has been issued by a function, which may depend on t and input signals, if its value is unambiguously/uniquely determined at the point in time Z by the chain. With a chain, it is consequently ensured that s always has the same value at the point in time $Z(t_0)$, whenever a certain series of input parameters occurs following a specific t0 and this series of input parameters sequentially fulfils $a'_0(t_0)$, $a'_1(T_1(t_0))$, $a'_2(T_2(t_0))$, . . . $a'_n(T_n(t_0))$.

If a chain determines an output signal at a point in time, then there is a corresponding function, which only depends on input signals, which sets the value of the output signal at this point in time. Chains, which determine the output parameters at some points in time, thereby specify input/output behaviour independent of any one individual circuit. Part of this invention encompasses the manner in which it can be checked as to when a chain determines the behaviour based on output and internal signals.

We describe a series $K_0$, $K_1$, $K_2$, . . . of properties, whereupon $K_n$ represents each property belonging to $P_0$, $P_1$, . . . $P_n$ as belonging to an infinite series $P_0$, $P_1$, $P_2$, . . . of properties (which very well may result from a finite quantity of properties and then occur on multiple occasions) and $T_1$, $T_2$, . . . . An infinite series $P_0$, $P_1$, $P_2$, . . . featuring corresponding reference points in time is called (infinite) K, if every finite partial series $P_0$, $P_1$, . . . $P_n$ is a chain $K_n$. An infinite chain K determines an output signal s at one point in time Z, if an index K exists such that all $K_i$ with i>k determine the output signal at the point in time Z.

If an infinite chain, which covers this input stimulus and which determines all output signals at all points in time with the exception of the initial partial component, can be formed from a quantity of properties for every input stimulus possible, then this quantity is complete in the above sense.

The conditions for checking completeness of properties of the above form "basic form" are:

1.) The existence of a reset property. This property is characterized in that its initial state is trivial, that is =true.

2.) A quantity of properties $N_P$ of successors of P must exist for every property P of the quantity of properties. This quantity of properties $N_P$ fulfils the following condition:

2a.) For every Q from $N_P$ the following must apply: Final $state_P$=>Initial $state_Q$. (=> stands for implication) This thereby justifies the adoption of Q into $N_P$.

2b.) Formation of the disjunction via all triggers of the properties from $N_P$, namely the property

```
theorem case_split_very_simple;
prove:
either
at t:   Trigger0 of property 1;
at t+1: Trigger1 of property 1;
at t+2: Trigger2 of property 1;
...
or
at t:   Trigger0 of property 2;
at t+1: Trigger1 of property 2;
...
or
...
end either;
end theorem;
```

If this property can be proven, it is known that a property Q can always be specified, with which it continues, if the final state of P has been reached. If this property has been proven for the quantity of successors of every property, one already becomes aware of the possibility of forming a chain for every input pattern that covers said input pattern.

2c) The condition

```
at   t:     Output description0;
at   t+1:   Output description1;
...
```

is to be designated with Out(t). A point in time $Z_{Po}$ for every output signal o is determined such that a type-correct constant w exists, where Out(t)=> at $Z_{Po}$:o=w applies.

A property Q' is formed for every Q from $N_P$, when t is replaced by $t+n_P$ such that the initial state of Q' is assumed at the point in time, at which the final state of P is affirmed. $t+n_P$ is designated as a reference point in time of P for Q in the following section. $Out_P(t)$ and $Out_Q(t+n_P)$ represents the output description for the event that P is followed by Q. This requires that there is a type-correct value w for every output signal o at every point in time T from the interval $[Z_{Po}, Z_{Qo}]$, where $$Out_P(t) \text{ and } Out_Q(t+n_P) \Rightarrow \text{at } T{:}o=w \text{ applies.}$$

This then ensures that the output values along the chain are unambiguously/uniquely determined, possibly with the exception of some points in time, which will be replaced by the reset property.

If the properties have been developed while taking the environment conditions into account, the consistency property case_split_very_simple can no longer be proven. Input patterns, with which the environment conditions are violated, are then generated as counter examples. Therefore, the property must be proven instead of the property case_split_very_simple with the environment conditions

```
theorem case_split_simple;
assume:
Environment condition;
prove:
either
at t:    Trigger0 of property 1;
at t+1:  Trigger1 of property 1;
at t+2:  Trigger2 of property 1;
...
or
at t:    Trigger0 of property 2;
at t+1:  Trigger1 of property 2;
...
or
...
end either;
end theorem;
```

The term of partial properties, with which the way the observed module communicates with the adjacent modules is described in terms of phases, shall be introduced. A partial property represents an initial component of a longer property. If A and C are the assumption and affirmation of the longer property and a and c the corresponding components of the partial property, then A=>a und C=>c must apply. Furthermore, the partial property must apply to the circuit checked.

The following quantity of properties shall be considered in order to motivate and illustrate the necessity of partial properties. It describes a module, which communicates with an adjacent module. This neighbouring module is supposed to be described in an environment condition.

This adjacent module affirms that it produces "10" or "01", whenever out_sig is set to "001". This is described in the environment condition E=(out_sig="001"=>next(in_sig)="10" or next(in_sig)="01")

The following specified properties $t_2$ and $t_3$ also actually describe the communication with the adjacent module: A request leads to the transmission of "001". The adjacent module returns in_sig="10" or "01" and an additional value based on out_sig is produced depending on this.

```
theorem t1;
assume:
at t:     state = idle;
at t:     request = '0';
prove:
at t+1:   state = idle;
at t+1:   out_sig = "000";
end theorem;
theorem t2:
at t:     state = idle;
at t:     request = '1';
at t+3:   in_sig = "10";
prove:
at t+4:   state = idle;
at t+1:   out_sig = "000"
at t+2:   out_sig = "001";
at t+3:   out_sig = "000";
at t+4:   out_sig = "101";
end theorem;
theorem t3:
at t:     state = idle;
at t:     request = '1';
at t+3:   in_sig = "01";
prove:
at t+4:   state = idle;
at t+1:   out_sig = "000";
at t+2:   out_sig = "001";
at t+3:   out_sig = "000";
at t+4:   out_sig = "110";
end theorem;
```

These properties are all to be contained in a quantity of successors. The property state_split_simple for this quantity of successors cannot be proven even under the environment condition E. A counter example to state_split_simple will e.g. at the point in time t show that state is set to idle and that request is also active, but set in_sig to "11" at the point in time t+3, such that none of the assumptions of $t_1$, $t_2$ or $t_3$ are fulfilled.

This problem arises because out_sig="001" in every case following a request is not included in the check and for this reason, only select values based on in_sig are allowed to occur at the point in time t+3. The communication described in $t_2$ and $t_3$, however, has two phases: on the one hand, the generation of "001" and on the other hand, the generation of "101" respectively "110". The check of the communication is therefore conducted in phases. First of all, the generation of "001" is described:

```
theorem partial:
at t:     state = idle;
at t:     request = '1';
prove:
at t+1:   out_sig = "000";
at t+2:   out_sig = "001";
end theorem;
```

This property originates when $t_2$ or $t_3$ are truncated at the point in time t+2. This kind of truncated property must generally be proven separately with the property checker.

The property case_split_simple can be proven with the assumptions of partial and $t_1$.

The entry in_sig is first evaluated in the next phase. For the verification, that is partially continued by $t_2$ or $t_3$, the following property is automatically assembled and proven:

```
theorem partial_consistency;
assume:
at t:     state = idle;
at t:     request = '1';
```

-continued

```
at t+1:   out_sig = "000";
at t+2:   out_sig = "001";
Environment condition;
prove:
either:
at     t:          request = '1';
at t+3:   in_sig = "10";
or      ...
at t:          request = '1';
at t+3:        in_sig = "01";
end either;
end theorem;
```

This property is assembled such that assumption and affirmation of the partial property are adopted into the assumption of the consistency property. This is possible because the property was proven on a partially separated basis. As a result, however, the environment condition also becomes applicable such that the property can actually be proven as a result.

Partial properties are often the initial components of other properties. The longest properties, namely those describing the entire communication, are designated as main properties. It is requested that the partial properties are formed for every main property P such that a finite, unambiguously/uniquely determined series $Q_n$, for which $Q_n$ is each partial property of $Q_{n+1}$ and P is the last element in this series.

As exemplified above, a partial property Q of a main property P can also be a partial property of another main property P'. For this, no displacements should result: Under the assumption that the point in time t in P' is replaced by a t+i with a whole number i, before the check is conducted as to whether Q is also a partial property of P'. In this case, it must apply that Q occurs in the partial property series of P and P'. In this way, the partial properties of all main properties form a graph, which is characterized as follows:

directed and cycle-free for every partial property, there is a path to at least one main property every main or partial property has at most one predecessor in the graph.

Such a graph is referred to as the partial property graph.

FIG. 1 shows various partial property graphs, FIG. 1*a*) is the partial property graph from the above example.

The completeness checker receives an annotated quantity of properties (1) with the following information:

Name, mode (input, output, internal) and type of each signal that is referenced in the properties.

A property $P_{reset}$ is to be specially issued as the reset property.

A main property, which is described in the following text. The elements of this quantity of properties are called main properties.

A graph of partial properties (partial property graph), which is described in the following text.

Every element from the quantity of main properties from (1) provides the following information: Quantity of temporal variables TT, consists of temporal variables $T_i$:

$T_0$ is to correspond to t, for i>0, every temporal variable is characterized by

- Basic temporal variable $B_i$ for i>0: $B_i$ corresponds to a $T_j$ where j<i.
- Temporal range $[Z_i, z_i]$ such that the temporal variable declaration is $T_i$=$B_i$+$Z_i$ . . . $z_i$.
- Localization condition of the form $L_i$=during [$B_i$+$Z_i$, $T_i$−1]: not $l_i$; at $T_i$: $l_i$ featuring a suitably selected Boolean condition $l_i$, which describes the allocation of the temporal variables $T_i$.

It is required that all property components subsequently described are exclusively described under the application of the $T_i$. The variable t, which is present as a keyword in ITL, may not be referenced.

The designations "requirement" and "conclusion" were selected in order to differentiate the portions of these specially annotated properties from the assumptions and affirmations, which can occur in every ITL property. The requirement becomes a component of the assumption and the conclusion for a component of the affirmation of an ITL property for the proof of such an annotated property on a circuit.

An environment condition E concerning the behaviour of the input signals in the connection to sites, at which the property checked was assumed. A part of the environment condition should be that the reset is never activated. The collaboration of environment and the observed circuit must, however, generally suffice for the property

```
theorem environment_constraint;
for timepoints:
T0 = t,
T1 = B1 + Z1 .. z1,
T2 = B2 + Z2 .. z2,
...;
assume:
L1; L2; L3; ...
A;
prove:
E;
end theorem;
```

However, E can frequently be proven without additional requirements.

Assumption of a determined range $[K_i, k_i]$ for every output $o_i$: In this temporal range, the property is intended to unambiguously/uniquely describe the behaviour of the outputs.

Assumption of data interpretation functions $D_1$, $D_2$, . . . with evaluation points in time $p_1$, $p_2$, . . . : The evaluation points in time for this are typically located close to the reference points in time from the quantity of successors (see below). With the specification of the data interpretation function, the user designates which data stored in the state are of such importance to the function of the circuit that they must be relayed onto the following property. Through the sequence of the values described by the data interpretation functions along a property chain, it should be apparent as to how these data are calculated from inputs.

Quantity of successors NN of properties $N_1$, $N_2$, . . . each together with a reference point in time $R_1$, $R_2$, . . . Every reference point in time must be greater than $T_0$. Furthermore, $P_{reset}$ may not occur in a quantity of successors.

The partial property graph is to correspond to the characterization in the previous section. A property Q in this graph is to be described by a quantity of temporal variables TTQ, an assumption $A_Q$ and an affirmation $C_Q$. $TT_Q$ should also contain its basic temporal variable with every temporal variable and be a partial quantity of a quantity of temporal values TT from the quantity of main properties from (1). If there is an edge q->Q in this graph of partial properties, then $TT_q$ should be a sub-quantity of $TT_Q$, where $A_Q$=>$A_q$ and $C_Q$=>$C_q$ apply. Isolated nodes from the graph can be both sources as well as sinks of this graph. The properties from the quantity of main properties from (1) should be located at the sinks in this graph. If there are paths from a source to two main properties, then they can only occur together or not at all in a quantity of successors. If they occur in a quantity of successors, the reference points in time R of the two properties must be the same.

Figure 3:
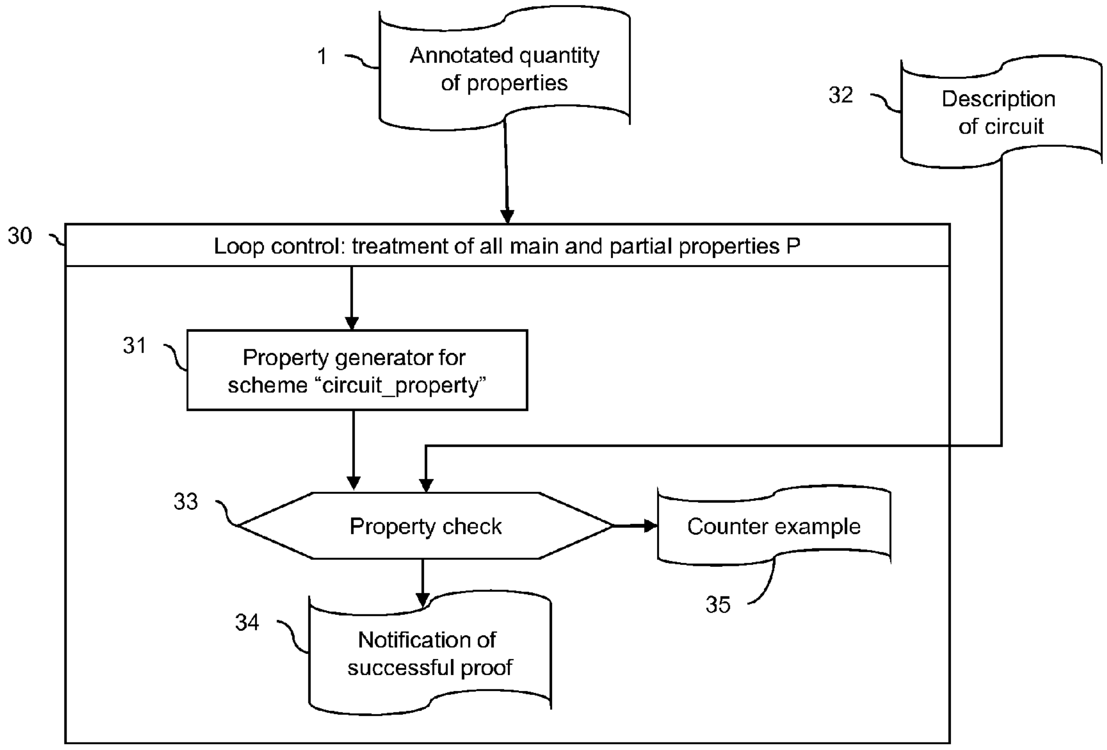
FIG. 3 describes a procedure for functional verification using a property checker corresponding to the state-of-the-art.

The verification of the properties on the circuit to be checked is described in FIG. 3. The properties on the circuit to be checked are processed under loop control (3), which ensures that every main and partial property P from the annotated quantity of properties (1) is inspected. With the help of the property generator (31), P becomes a property suitable for use with a property checker in accordance with the following scheme:

```
theorem circuit_property;
for timepoints:
T0 = t,
T1 = B1 + Z1 .. z1,
T2 = B2 + Z2 .. z2,
...;
assume:
L1; L2; L3; ...
A;
prove:
C;
end theorem;
```

This is checked with respect to the circuit description (32) (which is given e.g. in VHDL RTL) through the use (33) of a property checker. As a result, the property is either proved or disproved. The positive proof result (34) or the disproving sequence (35) is relayed to the user. The verification of these properties corresponding to the procedure complies with the standard practice of verification using property checkers. Both the main and partial properties must be verified.

The steps (30) to (35) can be conducted prior to or following steps (2) to (25).

The elements of the annotated quantity of properties (1) not used in the circuit property are required for the formation of the consistency properties, which are generated during the completeness check by the completeness checker and proven by a property checker. A trivial model (3) is generated from the annotated quantity of properties (1) by the model generator (2). This trivial model is a special final machine, in which all signals presented in the annotated quantity of properties (1) are presented twice and can be differentiated from input signals. Each signals that belong together are to be specified sequentially with s and $s^o$. In this way, though the trivial model (3) contains the type information, it does not contain any information regarding the circuit behaviour itself. As a result, the completeness checker is only familiar with the signal behaviour that is described by the main properties.

A description as to how consistency properties are generated from the main and partial properties, which are proven based on the trivial model (3) by means of a property checker, will now follow. If this is successful for all consistency properties generated, the completeness of the set of main properties has been proven. First of all, copies in the different sets of variables of the trivial model (3) are generated for all main and partial properties by means of the property copier (4) in order to assemble the consistency properties. The two copies of a property are designated as P and $P^o$ and at the same time, for all components A, $A^o$, C, $C^o$, . . . and so on. With this copying, the sets of temporal variables should be made differentiable such that the temporal variables $T^o{}_0$, $T^o{}_1$, . . . originate. The information $B_i$, $p_i$, $N_i$ and $R_i$ are not modified by the copying process (4).

Under the loop control (5), a primary consistency property is determined for every main property P and for every successor property P' from the quantity of successors of P. For this, the properties P' and $P^{o\prime}$ in (5') are first of all copied such that everything is adopted except for the temporal variables and the temporal variables are replaced such that they can be differentiated from the temporal variables in P and $P^o$. These "fresh" temporal variables are specified with $T'_i$ and $T^{o\prime}{}_i$. In the generator for the first test (6), a primary consistency property is generated from the above properties according to the following scheme.

```
1       theorem first_test
for timepoints:
T0 = t,
T1 = B1 + Z1 .. z1,
5       T2 = B2 + Z2 .. z2,
...
T°0 = T0,
T°1 = T1,
....
10      T'0 = R,
T'1 = B'1 + Z'1 .. z'1,
T'2 = B'2 + Z'2 .. z'2,
...
T'°0 = T'0,
T'°1 = T'1,
...;
assume:
during [t_first, t_last]: inputs = inputs°;
20      L1; L2; ....
A; C;
L°1; L°2; ....
A°; C°;
at  p0:      D0 = D°0;
25      at  p1:      D1 = D°1;
...
during [K0, k0]:   o0 = o°0;
during [K1, k1]:   o1 = o°1;
....
30      L'1; L'2; ....
A';
prove:
L'°1; L'°2; ...
A°';
35   end theorem;
```

For this, R is the reference point in time, which is specified together with P' in the quantity of successors of P.

In detail, the property is formed as follows: All temporal variable declarations from P are entered in lines 4 to 6. In lines 7 to 9, the corresponding temporal variables from $P^o$ are equated with their partner. In line 10, the initial point in time of P' is set to the reference point in time from P and the temporal variables are then entered in lines 11 to 13 in accordance with their declaration in P'. The temporal variables from $P'^o$ corresponding to this are equated with them in lines 14 to 16. The line 19 indicates that the signals classified as input signals in the annotated quantity of properties (1) and their respective copies will be equated with one another. In lines 20 and 22, all localization conditions from P and $P^o$ are specified, while the corresponding assumptions and proof targets are entered in lines 21 and 23. The equality of all data interpretation functions for their respective evaluating points in time are summed in lines 24 to 26. In lines 27 and 28, the equality of all output values during the time frame, in which P resp. $P^o$ are responsible for their determination, is furthermore assumed. In lines 30 and 31, the assumption of all localization conditions from P' and the requirement from P' occurs. All localization conditions and the requirement from $P'^o$ should be located in lines 33 and 34.

The validity of the property based on the trivial model (3) that is acquired in this way is proven by the implementation (7) of a property checker. This provides either a proof or a disproof (8), which is relayed to the user.

An additional property is created in the generator (9) for a secondary consistency property in accordance with the following scheme.

```
1      theorem second_test
for timepoints:
T_0 = t,
T_1 = B_1 + Z_1 .. z_1,
5      T_2 = B_2 + Z_2 .. z_2,
...
T°_0 = T_0,
T°_1 = T_1,
....
10     T'_0 = R,
T'_1 = B'_1 + Z'_1 .. z'_1,
T'_2 = B'_2 + Z'_2 .. z'_2,
...
T'°_0 = T'_0,
T'°_1 = T'_1,
...;
assume:
during [t_first, t_last]: inputs = inputs°;
20     L_1; L_2; ....
A; C;
L°_1; L°_2; ....
A°; C°;
at   p_0:      D_0 = D°_0;
25     at   p_1:      D_1 = D°_1;
...
during [K_0, k_0]:   o_0 = o°_0;
during [K_1, k_1]:   o_1 = o°_1;
....
30     L'_1; L'_2; ....
A'; C'
L°'_1; L°'_2; ....
A°'; C°';
prove:
35     during [k_0+1, k'_0]: o'_0 = o'°_0;
during [k_1+1, k'_1]: o'_1 = o'°_1;
...
at   p'_0:          D'_0 = D'°_0;
at   p'_1:          D'_1 = D'°_1;
40     ...
end theorem;
```

Up to line 30, this property is equal to the primary consistency property. The requirements and sequences are now entered in lines 31 and 33 here and all localization conditions from P' and P'$^{o}$ are entered in lines 30 and 32. Now the equality of the values for all output signals are to be proven in lines 35 to 37. The range, in which this equality is requested, is directly connected to the range, in which it was assumed in lines 27 to 29. Furthermore, the equality of the data interpretation functions is requested at its evaluation points (lines 38 to 40).

The property is again proven by means of the implementation (10) of the property checker or a disproof (11) is relayed to the user. After the loop control (4) has processed all pairs of sequential properties P, P' in compliance with the specification in the properties from the main quantity of properties (1), it relays the control to a second loop control (12), which sorts through all properties P from the quantity of properties (2) and assembles a property of the following scheme first_case_split for every P. The following notation is used for the description of the scheme: While regarding all relevant entries of every partial or main property as being parameterized by the temporal variables. All sources of the partial property graph, namely those properties, for which no shorter partial properties exist, are processed. For this, one limits oneself to the sources, from which a path through the partial property graph exists, which leads to a main property N belonging to one of the quantities of successors of P. These sources are referred to as $P'_j$ and designate their components with $A'_j$, $T'_{ji}$, $Z'_{ji}$, $z'_{ji}$, $L'_{ji}$ and so on, $R_j$ being the reference point in time, which is linked to N in the quantity of successors of P. Under the request that $R_j$ is unambiguously/uniquely determined, also in the event several N exist for $P'_j$.

A series $Bel_{j1}$, $Bel_{j2}$, . . . is formed for every source $P'_j$, whereupon every element of the series is to have the form $Bel_{jn}=(T'_{j0}=R_j, T'_{j1}=R_j+u_{jn1}, T'_{j2}=R_j+u_{jn2}, \ldots)$ with whole numbers $u_{jn1}$, $u_{jn2}$, . . . and the series $Bel_{jn}$ fathoms all possible allocations, which are permitted by the quantity of temporal variables of $P'_j$. With $A'_j$(Bel), a copy of $A'_j$ is described, whereupon all temporal variables corresponding to the allocation Bel are allocated. In the property generator (13), a property is to be formed in accordance with the following scheme:

```
theorem first_case_split;
for timevars:
T_0 = t,
5      T_1 = B_1 + Z_1 .. z_1,
T_2 = B_2 + Z_2 .. z_2,
...;
assume:
10     E;
L_1; L_2; ...
A; C;
prove:
either
15         A'_1(Bel_11); L'_11(Bel_11); L'_12(Bel_11); ...
or   A'_1(Bel_12); L'_11(Bel_12); L'_12(Bel_12); ...
or   A'_1(Bel_13); L'_11(Bel_13); L'_12(Bel_13); ...
or   ...
or   A'_2(Bel_21); L'_21(Bel_21); L'_22(Bel_21); ...
20     or A'_2(Bel_22); L'_21(Bel_22); L'_22(Bel_22); ...
or   ...
or   A'_3(Bel_31); L'_31(Bel_31); L'_32(Bel_31); ...
or   A'_3(Bel_32); L'_31(Bel_31); L'_32(Bel_31); ...
or   ...
25     or   A'_n(Bel_nm); L'_n1(Bel_nm); L'_n2(Bel_nm); ...
end either;
end theorem;
```

The temporal variable declarations, localization conditions, requirements and sequences of P are located in the lines 4 to 7, 11 and 12. Line 10 requests the validity of the environment condition E belonging to P. Lines 14 to 26 list the requirements and localization conditions of all sources $P'_j$ with paths to the quantity of successors of P and instantiates all possible allocations of the respective temporal variables from the respective $P'_j$. Through application of the property checker (14), this property is proven or a disproof (15) is relayed to the user.

Through the loop control (16), every node P' of the partial property graph, which itself is not a sink in the graph and for which a path through the partial property graph exists which ends with a property N of the quantity of successors of P, is now processed for every main property P. $P''_j$ is to be the successor of P' in the partial property graph. $Bel_{ji}$ is to be again a list of all permitted allocations of the temporal variables of $P''_j$, starting with $T'_0=R$, the reference point in time belonging to N. A property is formed by means of the property generator (17) according to the following scheme:

```
1       theorem second__case__split;
for timevars:
T_0 = t,
5       T_1 = B_1 + Z_1 .. z_1,
T_2 = B_2 + Z_2 .. z_2,
...,
T'_0 = R,
T'_1 = B'_1 + Z'_1 .. z'_1,
10      T'_2 = B'_2 + Z'_2 .. z'_2,
...;
assume:
E;
15      L_1; L_2; ...
A; C;
L'_1; L'_2; ...
A'; C';
20  prove:
either
A"_1(Bel_11); L"_11(Bel_11); L"_12(Bel_11); ...
or  A"_1(Bel_12); L"_11(Bel_12); L"_12(Bel_12); ...
or  A"_1(Bel_13); L"_11(Bel_13); L"_12(Bel_13); ...
25      or ...
or  A"_2(Bel_21); L"_21(Bel_21); L"_22(Bel_21); ...
or  A"_2(Bel_22); L"_21(Bel_22); L"_22(Bel_22); ...
or  ...
or  A"_3(Bel_31); L"_31(Bel_31); L"_32(Bel_31); ...
30      or A"_3(Bel_32); L"_31(Bel_31); L"_32(Bel_32); ...
or  ...
or  A"_n(Bel_nm); L"_n1(Bel_nm); L"_n2(Bel_nm); ...
end either;
end theorem;
```

This property differentiates from the property created by the property generator (13) as follows: In essence, the check is limited to those properties P", which represent a continuation of P' in the sense of the partial property graph. Therefore, the temporal variables Tj are added to the lines 8 to 11 and the requirements, sequences and localization conditions are added to the lines 17 and 18.

The property is proven through the use (18) of the property checker based on the trivial model (3) or a disproof (19) is generated and relayed to the user. In this way, the loop control (16) is abandoned and an additional two consistency properties are formed and proven via $P_{reset}$.

The reset property $P_{reset}$ is transferred to a consistency property by the property generator (20) in accordance with the following pattern:

```
1       theorem first__reset__test
        for timepoints:
        T_0 = t,
        T_1 = B_1 + Z_1 .. z_1,
        5       T_2 = B_2 + Z_2 .. z_2,
        ...
        T°_0 = T_0,
        T°_1 = T_1,
        ...;
        10
        assume:
        during [t__first, t__last]: inputs = inputs°;
        L_1; L_2; ....
        A;
        15  prove:
        L°_1; L°_2; ...
        A°;
        end theorem;
```

The lines 4 to 6 herein designate the temporal variables from $P_{reset}$, the lines 7 to 9 temporal variables from $P^{o}_{reset}$, which are equated with the corresponding temporal variables from $P_{reset}$. Line 12 again ensures equal entries in both sets of variables and in lines 13 and 14, the validity of the localization conditions and the requirement from $P_{reset}$ are assumed. Under these assumptions, it is proven that the localization conditions and the requirement also apply to the copied set of parameters.

This theorem is proven through the application (21) of the property checker or its disproof (22) is relayed to the user. In the property generator (23), an additional consistency property for $P_{reset}$ is formed in accordance with the following scheme:

```
1       theorem second__reset__test
        for timepoints:
        T_0 = t,
        T_1 = B_1 + Z_1 .. z_1,
        5       T_2 = B_2 + Z_2 .. z_2,
        ...
        T°_0 = T_0,
        T°_1 = T_1,
        ...;
        10
        assume:
        during [t__first, t__last]: inputs = inputs°;
        L_1; L_2; ....
        A; C;
        15      L°_1; L°_2; ...
        A°; C°;
        prove:
        during [K_1, k_1]:   o_1 = o°_1;
        during [K_2, k_2]:   o_2 = o°_2;
        20      ...;
        at p_1:              D_1 = D°_1;
        at p_2:              D_2 = D°_2;
        ...;
        end theorem;
```

Up to line 12, the property corresponds to the output from the property generator (20). In the lines 13 to 16, the validity of the reset property based on both sets of variables is required. In lines 18 to 20, the equality of the output signals based on both sets of variables is requested and in lines 21 to 23, the equality of the data interpretation functions to their evaluation points is also requested.

The property acquired in this way is proven through the application (24) of the property checker or a disproof (25) is relayed to the user.

If all applications (7, 10, 14, 18, 21, 24) of the property checker return a proof for the respective consistency properties, the user is issued a confirmation of success (26).

Proof

It should be shown that the behaviour of the output signals is unambiguously/uniquely determined, in any case following the points in time $K_i$ specified in the reset property and if the environment of the circuit is sufficient for the environment condition corresponding to the property environment-constrain (see below), in the event of a confirmation of success (26) through the properties from the quantity of main properties from (1).

For this, it is assumed that two circuits S and $S^o$ are present. S is to fulfil all main and partial properties P and $S^o$ is to fulfil all copied main and partial properties $P^o$. It should be shown that S and $S^o$ are similar to one another. Where $In_0$, $In_1$, . . . is a series of inputs, in which the reset at the beginning is activated corresponding to the reset property and which fulfils the environment conditions E corresponding to the property environment_constraints. Where $In^o_0$, $In^o_1$, is the copy of the series of inputs in the input signals of $S^o$.

The idea behind the proof is that a series $P_i$ of properties and a series $s_i$ of simulation points in time can be determined, from which it is possible for the proofs, that $s_i$ increases on a strictly monotonous basis, that $P_i$ can be applied, if the "general but fixed point in time t" is instantiated by $s_i$ that a series $P^o_i$ can be determined, in which every $P^o_i$ can be applied, if t is instantiated by $s_i$ and that equal behaviour of the output signals is forced by the series $P^o_i$ and $P^o_i$.

This is proven by means of complete induction.

Induction anchoring: The reset property can be applied to $In_i$ in the reset. If one assumes for this that t=0 is selected for this, then the generalization remains possible.

Therefore, an allocation of the temporal variables $T_i$ from the reset property exists such that its requirement A and the localization conditions $L_1, L_2, \ldots$ and so on are valid. According to this, the assumption of the property "first_reset_test" is fulfilled by the property transformer (16) for this allocation of temporal variables. Since this property has also been proven, all corresponding localization conditions $L^o_1, L^o_2, \ldots$ and the requirement $A^o$ of the copied reset property apply accordingly. In this way, the assumption of $P^o_{reset}$ is fulfilled. Since $P_{reset}$ itself on the circuit $S^o$ applies, the validity of the conclusion $C^o$ results. Since A and $L_1, L_2, \ldots$ apply, the validity of the conclusion C also results. Thus, the assumption of the property "second_reset_test" generated by the property generator (23) can be applied. This ensures the equality of the output signals within a certain temporal range. Furthermore, the equality of the data interpretation functions is affirmed at the respective evaluation point in time.

Inductive step: Under the assumption that the applicability of the properties $P_0 \ldots P_n$ to the series of inputs has been ensured, whereupon each t is to be instantiated by the elements of the purely monotonously increasing series $s_0, s_1, \ldots s_n$. It is furthermore assumed that the usability of the properties $P^o_0$ to $P^o_n$ is ensured for the series of inputs. In addition, it is assumed that t can also be set to $s_n$ for the use of $P^o_n$ and that, assuming this, the temporal variable allocations Bel and $Bel^o$ in $P_n$ und $P^o_n$ can be equally selected. This returns the equality of the output signals $o_i$ and $o^o_i$ up to the point in time, which results from $k_i$ under the allocation Bel.

The following is written in order to provide a simplified representation: $P=P_n$ and $P^o=P^o_n$. Since P on the circuit applies, the affirmation C also applies and the property first_case_split, which was created by the property generator (13) for P can accordingly be used. According to this, a partial property $P'_0$ exists, which represents a source in the partial property graph and an allocation $Bel'_0$, under which the requirement $A'_0$ and the localization conditions $L'_{01}, L'_{02}, \ldots$ apply based on the series of inputs In. Since $P'_0$ applies to S, $C'_0$ also applies. As a result, the property second_case_split from the property transformer (17) can also be used. This is the property (17), which affirms the existence of a partial property $P'_1$ for us, which is longer than $P'_0$ and for which, an allocation $Bel'_1$ exists such that $A'_1$ and $L'_{11}, L'_{12}, \ldots$ apply based on the series of inputs In. This consideration can be applied repeatedly up to a main property P' and an allocation Bel' of the temporal variables of P' have been found such that A' and the localization conditions $L'_1, L'_2$ of P' apply based on the series of inputs In. The value for $s_{n+1}$ results from the first element of Bel', which is larger than $s_n$ due to a request concerning the reference points in time such that the series $s_0, s_1, \ldots s_{n+1}$ is now also recognized as strictly being of a monotonous progression.

According to the considerations in the previous section, the assumption based on In of the property first_test created by the property generator (6) is fulfilled for P and P'. According to this, the requirement $A'^o$ and the localization conditions $L'^o_i$ of the copied $P'^o$ are also fulfilled, if the temporal variations of $P'^o$ are selected as in Bel'. In this way, the requirement and the localization conditions of P' and $P'^o$ are fulfilled. Since P' applies to S and $P'^o$ to $S^o$, the validity of C' resp. $C'^o$ is consequently shown under the allocation Bel'. As a result, the assumption of the consistency property second_test created by the property generator (9) for P and P' is fulfilled. The equality of the output signals $o_i$ and $o^o_i$ up to the point in time $k'_i$ and the equality of the data interpretation functions $D'_i$ and $D'^o_i$ can thus be determined at their evaluation points in time $p'_i$. This proves the inductive step.

It is to be shown that the value of the output signals is equal at any point in time: Where o is an output signal, P any property and $k_P$ the upper bound belonging to o of the determinedness range of o in the property P. P. $k_P$ results through $T+v_P$, where T is any temporal variable, $v_P$ an offset dependant on the property. Through the constraints concerning the selection of the temporal variables, T>=t and therefore $k_P$>=t+$v_P$. Where V is the minimum of all $v_P$ from a quantity of properties. Due to the strict monotony of the series of $s_i$, $s_n$>n and consequently $k_P$>=n+V. It correspondingly follows, no later than following the X-$V^{th}$ inductive step, that $o_i$ @X=$o^o_i$ @ X applies to an arbitrary point in time X. In this way, the proof is completed.

Applicable example of an interrupt controller. An interrupt controller is intended to process 8 interrupt inputs, which are to be numbered from 0 to 7. They should have set priorities corresponding to the numbering, whereupon 7 is the highest. Interrupts may appear as pulses. They are temporarily stored in the register pending_int. With the register mask, individual interrupts can be deactivated, in the event their assigned bit is set to 0.

If an interrupt is present, then the request signal int_req will be activated. Then the acknowledged is awaited, which is coded as a pulse in the signal int_ack. This acknowledgement is to arise between the $2^{nd}$ and $11^{th}$ cycle following the increasing edge of int_req. The interrupt controller issues a cycle following the arrival of the acknowledgement via the bus d_out as to which interrupt has the highest priority unmasked. At the same time, it blocks this said interrupt and all interrupts of lower priority.

The processor can describe the mask register via a bus access operation. For this, it activates the signal write_mask and returns the desired value in the signal d_in.

The setting of the unmasked interrupt of highest priority is to be occur in the function prioritize. The function reduce_mask is to modify the mask register as requested. The annotated quantity of properties (1) is to contain:

```
Signals:
        input   reset:      bit;
        input   int_ack:    bit;
        input   write_mask: bit;
        input   int_in :    bit_vector(7 downto 0);
        input   d_in:       bit_vector(7 downto 0);
        state   state:      state_t;
        state   pending_int: bit_vector(7 downto 0);
        state   mask:       bit_vector(7 downto 0);
        output  int_req:    bit;
        output  d_out:      bit_vector(7 downto 0);
```

For this, the type state_t represents a listing type, which contains the value idle along with other values, which are necessary as interim steps for the RTL implementation, but which are not referenced in the properties.

Reset property: Name is "reset" and $T_{reset}$=t+1

Macros for the definition of the environment conditions:

```
e0 :=   reset = 0;
e1 :=       if int_req = '1' and prev(int_req) = '0' then
next(int_ack, 1) = '1' or
next(int_ack, 2) = '1' or
next(int_ack, 3) = '1' or
next(int_ack, 4) = '1' or
```

-continued

```
        next(int_ack, 5) = '1' or
        next(int_ack, 6) = '1' or
        next(int_ack, 7) = '1' or
        next(int_ack, 8) = '1' or
        next(int_ack, 9) = '1' or
        next(int_ack, 10) = '1'
        end if;
```

$e_1$ affirms that the processor acknowledges the interrupt by the activation of the signal int_ack following no more than 10 cycles.

Quantity of Properties

Property Reset:

The quantity of temporal values $TT_{reset}$ only consists of the temporal variable $T_0$, for which no processing range declaration and localization information exist.

```
Requirement A_reset:
  at T0:          reset = '1';
  at T0+1:        reset = '0';
Sequence C_reset:
    during [T0, T0+1]: int_req = '0';
    during [T0, T0+1]: d_out = 0;
    at T0+1:          mask = "11111111";
    at T0+1:          pending_int = 0;
    at T0+1:          state = idle;
Environment condition E:
    during [T0+2, T0+12]: e0 and e1;
Determinedness range
    For int_req:  [K_reset, int_req, k_reset, int_req] = [T0, T0+1]
    For d_out:    [K_reset, d_out, k_reset, d_out] = [T0, T0+1]
Data interpretation function and evaluation point in time:
    D0 = pending_int, p0 = T0+1,
    D1 = d_out,       p1 = T0+1,
Quantity of successors and reference point in time
    N0 = idle,    R0 = T0+1,
    N1 = wm,      R1 = T0+1
```

The property int does not belong to the quantity of successors because it requires pending_int/=0, which prohibits the sequence in this case.

Property int Concerning the Processing of the Interrupt Protocol with the Processor:

```
Quantity of temporal variables TT_int consists of the variables
T0 and T1 = t_ack with the declaration
    t_ack = T0 + 2 .. 12;
and the localization information
during [T0+2, t_ack-1]: int_ack = '0';
at t_ack:          int_ack = '1';
Requirement A_int:
    during [T0, t_ack+1]: reset = '0';
    at T0:         state = idle;
    at T0:         write_mask = '0';
    at T0:         (pending_int and mask) /= 0;
Sequence/Conclusion C_int:
    at t_ack+1:      state = idle;
    during [T0+1, t_ack]:   mask = prev(mask);
    at   t_ack+1:      mask = prev(reduce_mask(
    mask, pending_int));
    during [T0+1, t_ack]:   int_req = '1';
    at   t_ack+1:      int_req = '0';
    during [T0+1, t_ack]:   pending_int = prev(
    pending_int or int_in);
    at   t_ack+1:      pending_int prev(
    (pending_int or int_in) and not prioritize(
    pending_int, mask));
    during [T0+1, t_ack]:   d_out = 0;
    at   t_ack+1:      d_out = prev(
    prioritize(pending_int,
    mask));
```

-continued

```
    Environment condition E:
        during [T0+2, T0+12]: e0 and e1;
Determinedness range
    For int_req:  [K_int, int_req, k_int, int_req]= [T0+1, t_ack+1]
    For d_out:    [K_int, d_out, k_int, d_out] = [T0+1, T_ack+1]
Data interpretation function and evaluation point in time:
    D0 = pending_int, p0 = t_ack+1,
    D1 = d_out,       p1 = t_ack+1,
Quantity of successors and reference point in time
    N0 = int,       R0 = t_ack+1,
    N1 = idle,      R1 = t_ack+1,
    N2 = wm,        R2 = t_ack+1
```

Property Idle Concerning that No Operation is Executed:

Quantity of temporal variables $TT_{idle}$ only consists of the variable $T_0$

```
Requirement A_idle:
    during [T0, T0+1]:     reset = '0';
    at T0:              state = idle;
    at T0:              write_mask = '0';
    at T0:              (pending_int and mask) = 0;
Sequence C_idle:
    at T0+1:            state = idle;
    at T0+1:            mask = prev(mask);
    at T0+1:            int_req = '0';
    at T0+1:            pending_int = prev(
    pending_int or int_in);
    at T0+1:            d_out = 0;
Environment condition E:
    during [T0+2, T0+12]: e0 and e1;
Determinedness range
    For int_req:  [K_idle, int_req, k_idle, int_req]= [T0+1, T0+1]
    For d_out:    [K_idle, d_out, k_idle, d_out] = [T0+1, T0+1]
Data interpretation function and evaluation point in time:
    D0 = pending_int, p0 = T0+1,
    D1 = d_out,       p1 = T0+1,
Quantity of successors and reference point in time
    N0 = int,       R0 = T0+1,
    N1 = idle,      R1 = T0+1,
    N2 = wm,        R2 = T0+1
```

Property wm Concerning the Modification of the Mask Register Mask:

Quantity of temporal variables $TT_{wm}$ only consists of the variable $T_0$

```
    Requirement A_wm:
        during [T0, T0+1]:     reset = '0';
        at T0:              state = idle;
        at T0:              write_mask = '1';
    Conclusion C_wm:
at T0+1: int_req = '0';
at T0+1: mask = prev(d_in);
at T0+1: state = idle;
at T0+1: pending_int = prev(pending_int or int_in);
at T0+1: d_out = 0;
    Environment condition E:
        during [T0+2, T0+12]: e0 and e1;
    Determinedness range
        For int_req:  [K_wm, int_req, k_wm, int_req]= [T0+1, T0+1]
        For d_out:    [K_wm, d_out, k_wm, d_out] = [T0+1, T0+1]
    Data interpretation function and evaluation point in time:
        D0 = pending_int, p0 = T0+1,
        D1 = d_out,       p1 = T0+1,
    Quantity of successors and reference point in time
        N0 = int,     R0 = T0+1,
        N1 = idle,    R1 = T0+1,
        N2 = wm,      R2 = T0+1
```

Partial Property Graph

In this case, the partial property graph only additionally contains the partial property int_p with a quantity of temporal variables $TT_{int\_p}$, which only contains $T_0$ for a requirement $A_{int\_p}$ with the following definition:

```
A_int_p :=
during [T0, T0+1]:      reset = '0';
at T0:                  state = idle;
at T0:                  write__mask = '0';
at T0:                  (pending__int and mask) /= 0;
```

and a conclusion $C_{int\_p}$ with

```
C_int_p :=
at T0+1:        int__req = '1';
```

The graph consists of the isolated nodes idle and wm and of an edge between the additional nodes int_p and int.

The properties in the property description language ITL are listed in Annex I. The macros a_reset, a_int, a_idle, a_wm, a_int_p designate the requirements and if applicable, also the localization information for the temporal variable t_ack. c_reset, c_int, c_idle, c_wm and c_int_p designate the affirmations.

The trivial model (3) will be created through the translation of the following VHDL description into the internal format of a property checker.

```
package p is
type state__t is (idle, busy1, busy2, busy3);
end p;
use work.p.all;
entity model is port (
reset__1:       in bit;
int__ack__1:    in bit;
write__mask__1: in bit;
int__in__1:     in bit__vector(7 downto 0);
d__in__1:       in bit__vector(7 downto 0);
state__1:       in state__t;
pending__int__1:    in bit__vector(7 downto 0);
mask__1:        in bit__vector(7 downto 0);
int__req__1:    in bit;
d__out__1:      in bit__vector(7 downto 0);
reset__2:       in bit;
int__ack__2:    in bit;
write__mask__2: in bit;
int__in__2:     in bit__vector(7 downto 0);
d__in__2:       in bit__vector(7 downto 0);
state__2:       in state__t;
pending__int__2:    in bit__vector(7 downto 0);
mask__2:            in bit__vector(7 downto 0);
int__req__2:    in bit;
d__out__2:      in bit__vector(7 downto 0)
);
end model;
architecture a of model is
begin
end a;
```

This represents the description by the model generator (2).

The property copier (4) creates copies of the properties for various parameter sets. This is represented through the macro definitions a_int_1, a_int_2, a_int_p_1, a_int_p_2, and so on in the Annex. The actions of the property generators are represented by means of the properties created, which can be checked using the property checker based on the trivial model.

The formal verification of properties via the model and the corresponding check for completeness can be conducted in increments. A property is proven based on the model and subsequently demonstrated using the procedures presented here that it functions together with the other properties.

Automatic Determination of all Redundant Specifications:

In the following text, a stage previous to the invention-pursuant procedure will be described, in which only the quantity of properties and a signal declaration must be specified. It determines all user specifications resulting from the main procedure that can be determined such that only the environment assumptions have to be specified as an additional user specification for the main procedure.

This representation is limited to the environment assumptions, which are not dependant on output or internal signals.

Figure 4:
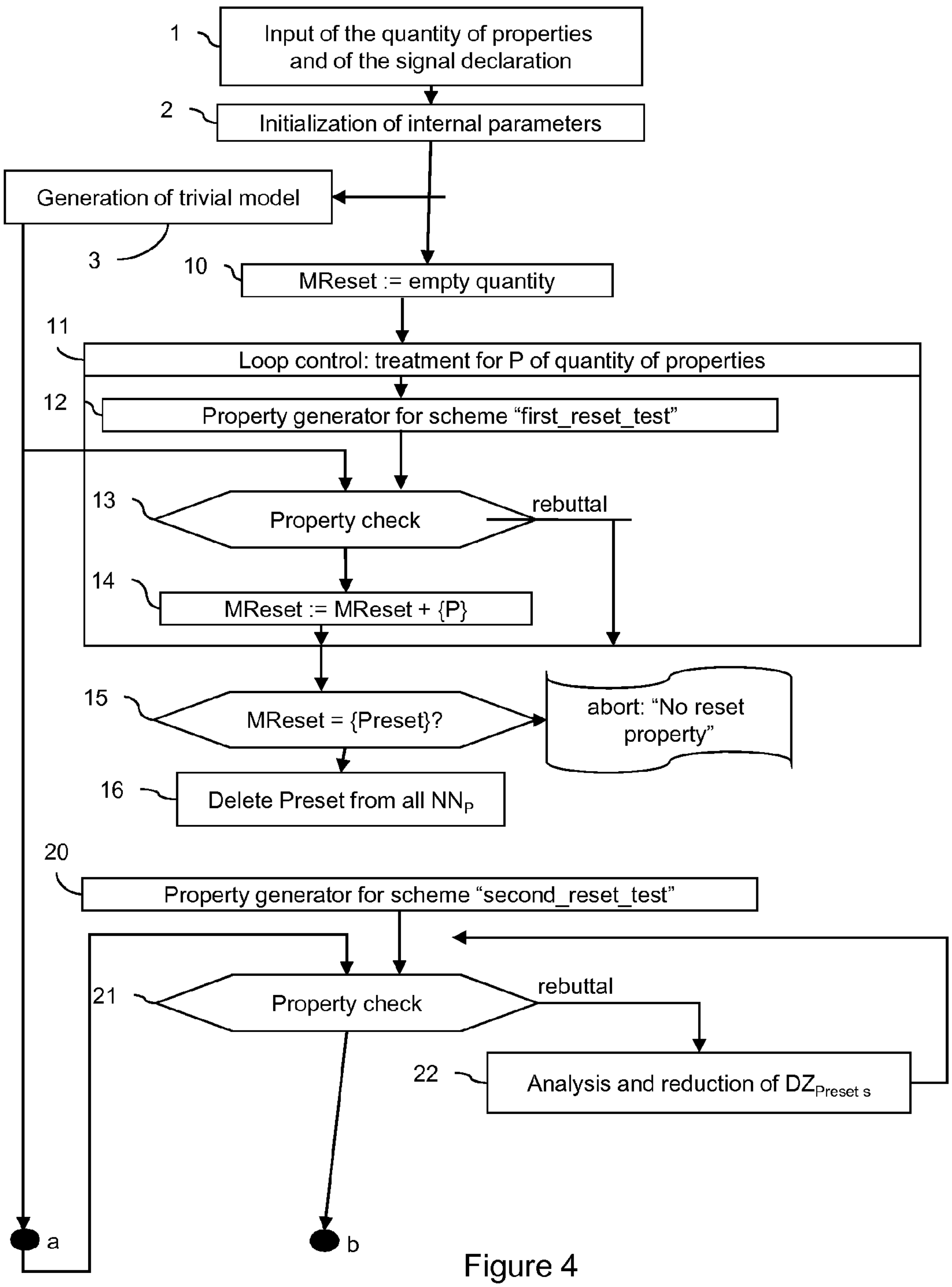
FIG. 4 depicts a procedure for determining redundant specifications for the completeness checker and the determination of the measured value.
Figure 4:
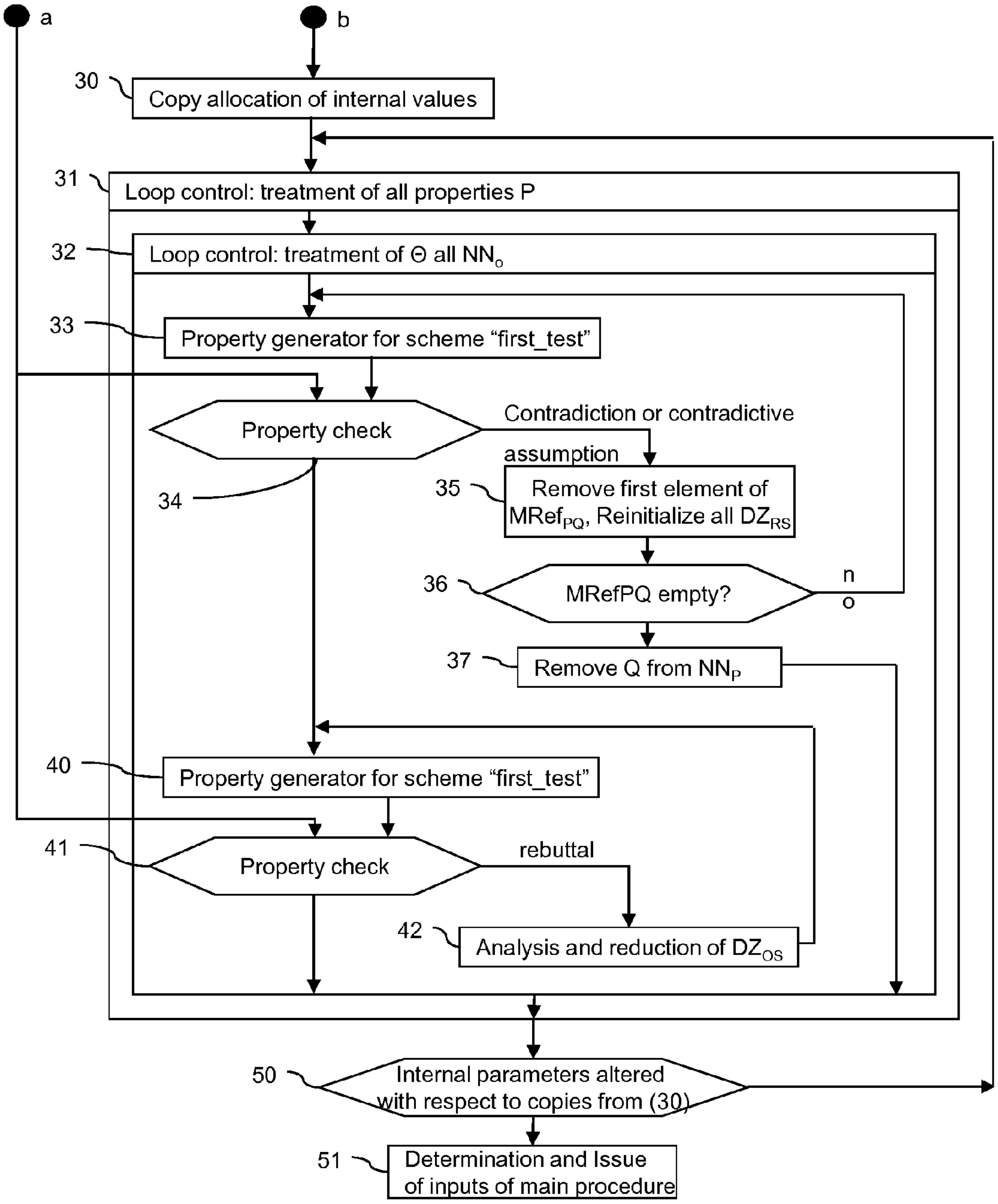

A process diagram is provided in FIG. 4 of this procedure. In step 1 of the procedure, the properties and the signals with the type and mode (input, output and internal signal) are read. In step 3, a trivial model is generated from the signal declaration.

The procedure itself operates with internal parameters, which have nothing to do with the internal parameters of the tested circuit. In step 2 of the procedure, the internal parameters of the procedure are pre-allocated in the following manner: The quantity of the successors $NN_P$ is pre-occupied by the quantity of all properties for every property P. For every pair P, Q, the quantity $MRef_{PQ}$ of all possible reference points in time is pre-occupied with a list of all points in time of the form T+u, for which T is a temporal variable of the property P and an entire number u is selected such that T+u is located in the inspection window of P for at least one allocation of T. The order of the elements in the list is arbitrary.

For every output and internal signal s, the amount of the temporal ranges $DZ_{Ps}$, in which the definiteness of s is to be checked, is pre-occupied as follows: All temporal ranges, at which s is evaluated in the property P corresponding to the following definition, are adopted in a first pre-occupation step:

- All logical lines of the property (corresponding to the ITL description at the beginning of the document) are checked independent of whether they are linked with one another.
- In an expression of the form during [a, b]: P is evaluated as P in the temporal range [a, b]
- In an expression of the form within [a, b]: P is evaluated as P in the temporal range [a, b]
- In an expression of the form at T: P is evaluated as P in the temporal range [T, T].
- In order to evaluate an expression in a temporal range, its partial expressions in this temporal range are evaluated. If one of these partial expressions is the signal s, then this temporal range is adopted into $DZ_{Ps}$.
- In order to evaluate next(P,n) in the temporal range [a, b], P is evaluated in the temporal range [a+n, b+n].
- In order to evaluate prev(P,n) in the temporal range [a, b], P is evaluated in the temporal range [a−n, b−n].
- In order to evaluate P @ T in an arbitrary temporal range, P is evaluated in the temporal range [T, T].

The definition of "evaluation in a temporal range" corresponds to the definition of "evaluation at a point in time" from the introduction of ITL, but maintains the fact that the temporal ranges can vary in size through the varied selection of temporal variables in P.

In a second pre-occupation step, each temporal range [a, b] is inspected, which has been adopted into $DZ_{Ps}$ in the first pre-occupation step. If there are points in time therein of the form T+u (T being a temporal variable and u a whole number I), which are contained in this temporal range [a, b] for all possible allocations of the temporal variables of P, then the point in time T+u represented by the temporal range [T+u, T+u] will also be adopted in $DZ_{Ps}$.

In the steps 10 to 15, the initialization or reset property is identified. For this, the quantity MReset is pre-occupied in process step ten as an empty quantity, in which the reset property is to be subsequently located. In the loop 11, all properties P are run and transferred to a consistency property using the property generator 12 for the property scheme "first_reset_test". This is checked in step 13 by the property checker based on the trivial model. In the case of a proof, the property P is added to MReset in step 14, in all other cases it is not added. In this way, the loop 11 is completed. In step 15, a check is conducted as to whether the MReset only contains one element, that is, whether the reset property $P_{Reset}$ has been unambiguously/uniquely determined. If not, the procedure is interrupted. In step 16, the reset property from all quantities of successors $NN_P$ is removed.

In the steps 20 to 22, the quantity of the determinedness temporal ranges of the reset property is determined. For this, a consistency property similar to second_reset_test is assembled in the property generator 20. The lines 18 to 23 are, in deviation to this scheme, formed by during[a,b]:s=s° whereupon s is every output and internal signal and [a,b] every temporal range from $DZ_{PReset\ s}$.

This property is subject to the property test 21 based on the trivial model. In the case of a counter example, it is determined in the counter example analyzer 22, which partial conditions for the affirmation of the consistency property have been violated and the corresponding temporal ranges are removed from $DZ_{PReset\ s}$. The property generator 20 is then restarted. This loop is completed once the property check 21 has found a proof.

In step 30, copies of the current allocation of the internal parameters of the procedure are created. All properties P are run in the loop managed by the loop control 31. All properties Q from the quantity of successors $NN_P$ to P are run in the loop managed by the loop control 32. Consistency properties for P and Q are created in the property generator 33 according to the scheme "first_test". For this, the first value in $MRef_{PQ}$ is selected as the reference point in time. Furthermore, the lines 24 to 29 are replaced in the manner described above for the property generator 20 by means of statements concerning all output and internal signals for the quantities $DZ_{Ps}$ in the temporal ranges. In the property test 34 based on the trivial model, the assumption may arise as being self-contradictory or the property is disproved or the property is proved. In the event of a disproved assumption or disproved consistency property, the first element of $MRef_{PQ}$ is removed in step 35 and all $DZ_{Rs}$ are occupied with their initial value for all properties. In step 36, it is checked whether $MRef_{PQ}$ has become empty as a result of this. In this case, the property Q is removed from $NN_P$ in step 36 and continued with the next process step corresponding to the loop administration 32. If it was found in step 36 that $MRef_{PQ}$ is not yet empty, then it will be continued with process step 33 on the basis of the modified parameters.

If the consistency property is proven in the property check 33, then a property corresponding to "second_test" is created by the property generator 40. In turn, the lines 24 to 29 of this property scheme are replaced by conditions concerning the temporal ranges of $DZ_{Ps}$ and the lines 35 to 40 by conditions concerning the temporal ranges of $DZ_{Qs}$. During the property check 41 based on the trivial model, either a counter example may arise or the consistency property is proven. If a counter example is returned, then the lines in violation are determined in the counter example analyzer 42 and the corresponding temporal ranges are removed from $DZ_{Qs}$. Afterwards, it continues with process 40 on the basis of the modified parameters.

If the consistency property in step 41 is proven, then it continues on with the next process step corresponding to the loop administration 32. If the loops 32 and 31 are finished, it is then determined in process step 50 as to whether the current copies of the internal parameters of the process and those saved in the process step 30 have stayed the same. If they are not identical, then step 30 is continued on the basis of the new allocation of the internal parameters.

If they have stayed the same, then it is ensured that the series of properties described in the first elements of the $MRef_{PQ}$ by $NN_p$ and the reference points in time are chains. Furthermore, the $DZ_{Qs}$ clarify at which times the output signals in these chains have been determined. In step 51, the entries for the main procedure are now determined and issued as follows:

- The quantity of properties (with temporal variable description and environment assumptions) is the one relayed to the procedure.
- The signal declaration is the one relayed to the procedure.
- The $NN_P$ describe the quantity of successors of a property P.
- The first elements from the lists $MRef_{PQ}$ form the reference points in time.
- The reset property $P_{Reset}$ is the one determined by the procedure.
- All points in time in the form T+u, where T is a temporal variable and u a whole number, are determined for a property P and an internal signal s. Said points in time are located in the union set of the temporal ranges in $MRef_{Ps}$ for all allocations of the temporal variables of P. These points in time form the evaluation points in time p for the data interpretation function D=s.
- A greatest interval [T+u, T'+u'] (T, T' a temporal variable from P, u, u' a whole number) is determined for a property P and an output signal o. Said interval forms a sub-quantity of the union of the temporal ranges in $DZ_{Po}$ for all temporal variable allocations. This interval is relayed as a determinedness interval [K, k] of the signal o with respect to the property P.
- The properties form a trivial partial property graph, which has no edges. This is possible because it was required that the environment conditions do not depend on the output and internal signals.

In this way, all redundant information is determined which is required for the completeness check and for determining the measure of completeness.

The request $o_i = o^{\circ}_i$ for the determinedness of the output signals can be diminished. This is particularly useful, if output signals are only allowed to be evaluated once they have been designated as valid by means of a validation signal. For this, a quantity of determinedness conditions $Det_1$, $Det_2$, . . . uniform for all properties is defined in the annotated set of properties. Said conditions are described on the basis of all signals s and s° of both signal quantities. The determinedness time frames will then no longer be specified for every output signal, but rather for every determinedness condition.

By means of limited adjustment of the procedure, it can be ensured that the model properties prove the validity of a Boolean formula (which may also evaluate signal values at other points in time using prev and next) at any point in time.

The determinedness conditions $o_i=o^o_i$ are supplemented for this purpose by means of requests of the form cond='1', whereupon cond represents the questionable Boolean formula. Justification: Based on the proof of the procedure invented, it is apparent that a condition of the form cond='1' and $cond^o$='1' proves that cond is determined and is always '1'. In the case of a counter example, either cond='0' is true. This counter example would therefore also contradict the request cond='1'. In the event $cond^o$='0' is true, an allocation of the copied variables exists, which was the cause of this counter example. This allocation, however, can be transferred to the uncopied variables, which then returns cond='0'.

In the lines 21 and 23 of the property scheme first_test and second_test, the line 12 in the property scheme first_case_split and the lines 16 and 18 of the property scheme second_case_split, it is planned that the requirement and sequence of a predecessor property P is completely adopted in the assumption of the respective consistency property. In many cases, however, it is sufficient to adopt only components a, $a^o$, c and $c^o$ of the assumptions A, $A^o$, C and $C^o$ of the properties P and $P^o$, which are formed such that A=>a, $A^o$=>$a^o$, C=>c and $C^o$=>$c^o$ apply. The quantity of temporal variables tt resp. $tt^o$, based on which these components are defined, can then be smaller than the original quantities of temporal variables TT resp. $TT^o$. tt must be formed such that there is a signed element to from TT and that with every temporal variable unequal to $t_0$, which is used in a, c, in the definition of the right limits $k_i$ for the determinedness intervals or in setting of the evaluation points in time $p_i$ of the data interpretation function $D_i$ also contains every corresponding basic temporal variable. $tt^o$ is to contain call copies of the temporal variables of tt. The declarations for the temporal variables $T_i$ and $T^o_i$ in the property schemes can then be reduced to the elements of tt and $tt^o$ as well as the lists of the localization information $L_i$. $t_0$=t is declared in deviation to this. The temporal range, in which the equality $o_i=o^o_i$ of the output signals is assumed, can be likewise reduced or these assumptions will be completely erased. All reductions described reduce the run times of the proofs for the consistency properties.

Examples for the formation of a from A and c from C (and in a series thereof also $a^o$ and $c^o$) are:

a=true and c is specified by the user. The user specifications can e.g. describe the final state in terms of how it was used in a simple introductory example. In this case, identical consistency properties can arise for various properties and must then also only be inspected once.

Syntactic analysis: The overlapping set of the signals for every pair P, P' is formed, which on the one hand occur in A or C and occur on the other hand in A'. a and c are then formed from A and C, whereupon all logical lines are erased, in which none of the signals from the overlapping set occurs. tt is then selected corresponding to the above mentioned conditions.

Second Example of Execution:

The invention-pursuant procedure of the preferred form of execution described previously is not limited to the explicit specification as to which properties follow one another with which reference points in time. The basic idea of the interlinking of properties is also utilized in the following procedure. However, consistency properties are assembled in this procedure, for whose proof these chains are implicitly formed.

A significant component of these consistency properties is manifested by implications, into which the main and partial properties are transferred. The following implication is formed for a property P with the requirement A, the affirmation C, the localization conditions Li and the environment assumption E:

$$P'(t,\text{Bel})=(A \text{ and } L_1 \text{ and } L_2 \text{ and} \ldots)\text{implies}(C \text{ and } E);$$

P' is instantiated with the point in time t and the allocation Bel of the temporal variables. The following is formed for the properties $P_1$, $P_2$, $P_3$, . . . :

```
assume_props(t_anf, t_end) =
forall tt in [t_anf, t_end]:
P'1(tt, Bel11) and P'1(tt, Bel12) and ... and
P'2(tt, Bel11) and P'2(tt, Bel12) and ... and
...;
```

The point in time t_anf and t_end are to be selected in a sufficient size. assume_props is to also be transferred to the copied variable set, this is to return the condition assume_props$^o$(t_anf, t_end).

assume_props and assume_props$^o$ are to be given in the assumption of a consistency property. t_anf and t_end are to cover a time frame of sufficient size. The prover will select an instance of the implications, whose left side is fulfilled by the start of the chain and the input series for a suitable start of a chain (that is for a condition concerning the value of the internal signals) and for an arbitrary series of input signals. The right side then provides the information concerning outputs and internal signals, which in turn can fulfil a left side of an implication, thereby providing further information and so on.

This is the basis of the following procedure: In the property graph, which is presented in FIG. 6 as an example, some nodes are marked as start and/or end nodes. The mark should be selected such that the following conditions have been fulfilled:

- all paths beginning in a start node contain an end node.
- each property may only occur once in each path of a start node for an end node, which contains no other end node. However, start and end nodes may designate the same property.

Corresponding with the assumption in the property scheme, the condition for every start node P is defined as:

```
det_condP(t, Bel):=
L1; L2; ....
A; C;
L°1; L°2; ....
A°; C°;
at  p0:      D0 = D°0;
at  p1:      D1 = D°1;
...
during [K0, k0]: o0 = o°0;
during [K1, k1]: o1 = o°1;
....
```

The condition is parameterized through the allocation Bel of the temporal variables in the manner described for first_case_split. Furthermore, the point in time t of the model property is emphasized in order to be able to instantiate it in a suitable manner. The start condition is formed by

```
det_cond_start(t) :=
either
det_condP1(t, Bel11) or det_condP1(t, Bel12) or ... or
det_condP2(t, Bel21) or det_condP2(t, Bel21) or ... or
...
end either;
```

For this, the P1, P2, . . . run through all start nodes. The end condition is formed by

```
det_cond_end(t) :=
either
det_condQ1(t, Bel11) or det_condQ1(t, Bel12) or ... or
det_condQ2(t, Bel21) or det_condQ2(t, Bel21) or ... or
...
end either;
```

For this, the Q1, Q2, . . . run through all properties, which have been marked as end nodes.

assume_props is formed from the following properties in the form described above:

- all end nodes
- all nodes between a start and end node, but not the start nodes themselves
- all partial properties leading to the above properties, which are assigned to the nodes described above, on a path in the partial property graph.

The consistency properties are then:

```
property reach_det_cond is
assume:
during [t, t+w+m]: input_equality;
assume_props(t, t+w);
assume_props°(t, t+w);
det_cond_start(t);
environment_constraints;
prove:
exists t_end in [t+1, t+w]: det_cond_end(t_end);
end property;
property check_det_out is
for timepoints:
t_dc = t+1..wsize;
assume:
during [t, t+w]: input_equality;
assume_props(t, t+w);
assume_props°(t, t+w);
det_cond_start(t);
environment_constraints;
forall t_v in [t+1, t_dc−1]: not det_cond_end(t_v);
det_cond_end(t_dc);
prove:
during det_interval1(t_dc): outsig1 = outsig°1;
during det_interval2(t_dc): outsig2 = outsig°2;
during det_interval3(t_dc): outsig3 = outsig°3;
...
end property;
```

For this, the variable w must be chosen sufficiently large in order to cover the longest path in terms of time through the property graph and m should be selected such that it covers the largest inspection window length of the properties, from which assume_props was formed. environment_constraints describe the environment assumptions, which are assigned to the properties, which occur in det_cond_start.

Following the proof of both consistency properties, it is ensured that the properties in the partial graph of the property graph defined by the start and end points are able to cover every input series such that the values of the output signals are unambiguously/uniquely determined based on the respective intervals $det\_interval_i$.

If the quantity of the start and end nodes is identical during the disassembly of the property graph and the intervals det_interval have been chosen in a suitable manner, both of these properties are sufficient for proving the completeness of the corresponding property set with the exception of the behaviour in the proximity of the reset. The completeness then results from induction: First of all, det_cond_start(t)=det_cond_end(t) applies. reach_det_cond shows that det_cond_start can be reached after a finite period of time and check_det_cond shows that the outputs in the interim period are unambiguously/uniquely determined.

It can be similarly argued that when the property graph is broken into multiple partial graphs such that all end points of a partial graph are also the start points of said graph or of another graph and vice-versa, every start point is also an end point.

This procedure presents an extension of the previously described procedure because it has the significant basic idea in common with it, that is, the formation of chains of properties and the inspection that the values of the output signals are unambiguously/uniquely determined along these chains.

Third Example of Execution

The invention is not limited to properties, which have been processed by means of formal verification. Rather, the properties can also be checked with a simulation instead of with the procedure as per FIG. 3, for example, when they are transformed into monitors (assertion-based verification). If a violation of the property is detected, then the monitor reports this by activating an error signal or by means of a run time output.

The execution example described here monitors that a quantity of properties is able to actually recognize every error in the output pattern of a simulation. In this way, it is the first known aid for the automatic quality assurance of error detection processes during the simulation.

Fourth Example of Execution

In the procedure of the fourth example of execution, the quality of a quantity of measurement conditions for determining the diversity and variety of input patterns for the simulation is to be determined. In this manner, it can be ensured that a quantity of "functional coverage points" illuminates every component of the circuit.

To present, conditions have been formulated, whose fulfillment is counted over the course of a simulation. These numbers are used to evaluate the diversity and variety of input patterns for a simulation (coverage). The conclusiveness of this evaluative procedure is dependant on the selection of conditions. There are two classes of conditions: The one class recognizes the execution of components of the circuit description (structural coverage), while the other recognizes specific behaviour based on signals from the circuit. The conditions of the first class can be determined in an automatic and consequently highly efficient manner. An important class of such evaluative procedures arises from conditions, which are oriented with the code of the circuit description. Such conditions are e.g. then fulfilled, if a line in the circuit description is executed. These conditions are automatically generated for every line and the subsequent evaluation of quality determines the relation between the lines, which have been executed at least once and all lines. This procedure ensures that every circuit component has been checked at least once. The quality measurement, however, does not consider various functional effects, e.g. the inherent parallel nature of circuit descriptions. If the verification engineers recognize necessity, they then manually insert temporally logical conditions, which are fulfilled for such problematic processes. The specification of such conditions is time-consuming and remains therefore reserved as critically recognized components of the circuit functionality.

The assumptions from a complete quantity of properties combine both advantages: They code functional aspects and check each component of the circuit. To this extent, the invention also enables the provision of a particularly critical set of such provisions. The affirmations concerning the output signals are of no significance for this such that the properties need not be generated in accordance with the scheme "second_test" and not be checked.

If an annotated quantity of properties has not been fully recognized as being complete, the possibility of generating a measure related to remaining work to be performed and can thereby play a similar role in the planning and monitoring of a verification process such as the (coverage) measure for diversity and variety for the input patterns in the context of the simulation.

In contrast to the context of the simulation, where the measures are certainly able to give a false impression of security, the procedure described in the following section only returns the value 1 once the quantity of properties is complete. In addition, the measure, which is determined for an upper quantity B of a quantity of properties A, is always greater than or equal to the measure for A.

In the following representation, ITL conditions are regarded as Boolean expressions concerning variables, which consider the value of a signal at one point in time. The variables themselves are not subject to time, rather several variables result when a signal is evaluated at different points in time. In actuality, the variables are pairs (<signal>, n). Their allocation with a value stipulates the value of the signal at the point in time t+n. As a result, <signal>@t+n applies to these variables, whereupon t is the arbitrary, but fixed point in time from ITL, relative to which all time data are generated.

Where B is a condition, in which no temporal variables except for t occur. Then, the carrier sup(B) is the quantity of all variables s@t+n such that s is a signal that is reference in the condition B at the point in time t+n. If B also contains temporal values, sup(B) is defined as sup(B($Bel_1$) or B($Bel_2$) or B($Bel_3$) . . . ), whereupon the $Bel_i$ fathom all values of the temporal variables that are permitted. sup(B) is a finite quantity of variables, which is to be arranged linearly in some manner, perhaps through lexographic arrangement. In this way, the elements of this quantity of variables form a finite tuple. Where the quantity of definitions def(V) of a quantity of variables is the quantity of all value tuples, which can correctly to these variables occupy the variable tuple from V based on their type. Instead of def(sup(B)), one can also write def(B).

Example: For a 2-element bit vector $sig_1$ and a sign-bit signal $sig_2$, the ITL condition B corresponds to=

```
at        t:                sig1 = "00";
during [t, t+1]: sig2 = '1';
```

from the Boolean expression $sig_1@t$="00" and $sig_2@t$='1' and $sig_2@t+1$='1', has the support sup(B)=($sig_1$ @ t), ($sig_2$ @ t), ($sig_2$ @ t+1)) and the quantity of definitions def(sup(B))={("00", '0', '0'), ("00", '0', '1'), ("00", '1', '0') ("00", '1'), ("01", '0', '0'), . . . ("10", '0', '0'), . . . ("11", '1', '1')};

Where B is a condition, whose carrier is a partial quantity of a quantity of variables V. Then, the cardinality card (B, V) of B based on V is to fulfil the number of elements from def(V), if one correspondingly allocates the variables B. card (B, V) can be automatically determined e.g. when the BDD for B is generated and then the applicable algorithms are utilized for this. Instead of card(B, sup(A)), one can write card(B, A).

For any quantity M, card(M) is to designate the number of the elements in M.

Figure 6:
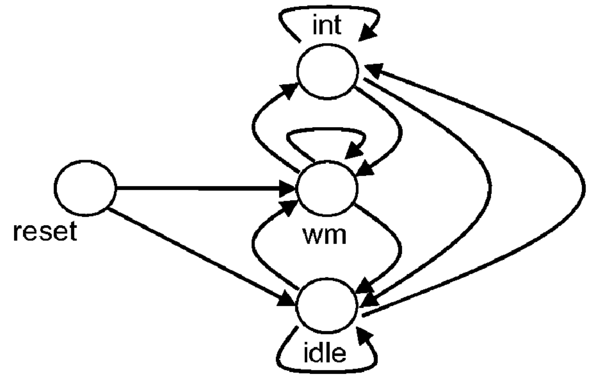
FIG. 6 shows the graph of the complete property machine from the example.

The basic idea of the procedure of the fourth example of execution lies in considering the properties and their quantity of successors as transitions in a machine, which is referred to as the property machine. The property machine for the first example of execution is represented in FIG. 6.

The property machine of an incomplete quantity of properties will not clearly produce an output pattern for every input pattern. The basic idea of the procedure lies in accounting for the portion of the input patterns, for which the outputs can be determined.

Figure 7:
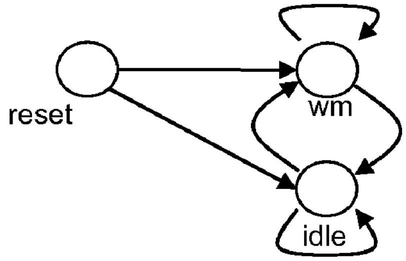
FIG. 7 depicts the graph of an incomplete property machine.

An example for a property machine for an incomplete quantity of properties is specified in FIG. 7. It is the property machine for the circuit described in FIG. 6, but without the property int. This may, for example, correspond to a count in the verification of the example circuit.

Figure 8:
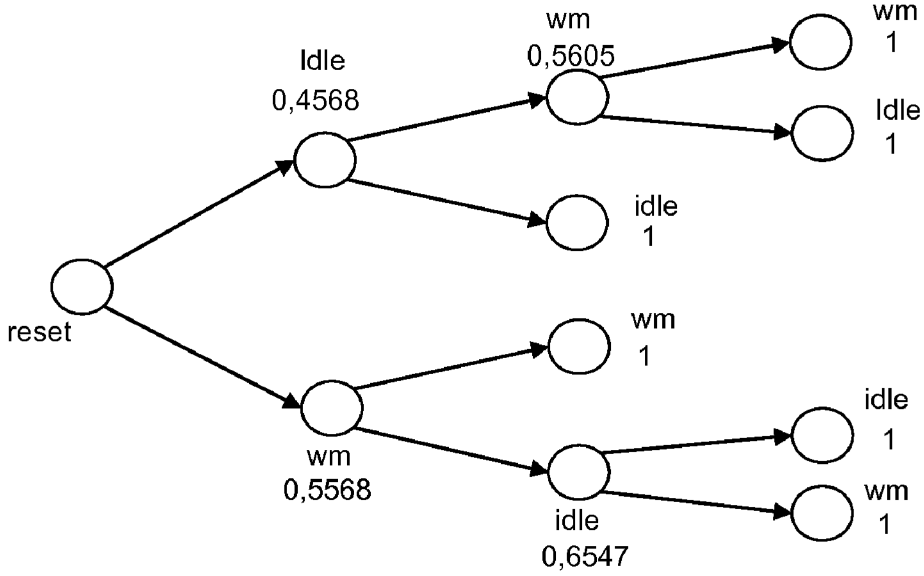
FIG. 8 depicts the execution tree of the property machine from FIG. 7 that is annotated with interim results from the determination of the measure of completeness.

In an important step of the procedure, the property machine is processed. As a result, a tree starting with $P_{reset}$ originates. A property is assigned to each node and the properties from the quantity of successors are assigned directly to its sons. The branches of the tree are cut as soon as a property is assigned to a node, which already appears on the path between $P_{reset}$ and said node. The node with the re-occurring property is then called a complete end node in contrast to empty end nodes, whose property has an empty quantity of successors. Such a tree is called an execution tree of the set of properties. FIG. 8 provides an example of an execution tree for the incomplete property machine from FIG. 7.

It is determined for every path of $P_{reset}$ for a full or empty end node, which portion of all possible stimuli has been covered by it. This value is reduced, if the path leads to an empty end node or if the outputs along the path are not precisely described. The sum of these values adjusted in this manner returns the measure of completeness.

It is only equal to 1, if the quantity of properties is complete in the sense of this patent application. In all other cases, it is less than 1 and increases with every property, which increases the property machine.

The procedure for determining the completeness measure is a particularly preferred procedure in terms of the invention in question. The properties, which are formed in accordance with the scheme first_test, check the accuracy of the quantity of successors. By means of the repeated application of properties, which are formed according to the scheme second_test and successive reduction of the affirmations concerning the output determinedness, it can be determined for a pair of properties P, P' as to how complete the output description is by means of P'. Furthermore, it is determined which portion of the input patterns covers a requirement in the disjunction according to first_case_split and second_case_split.

Figure 2:
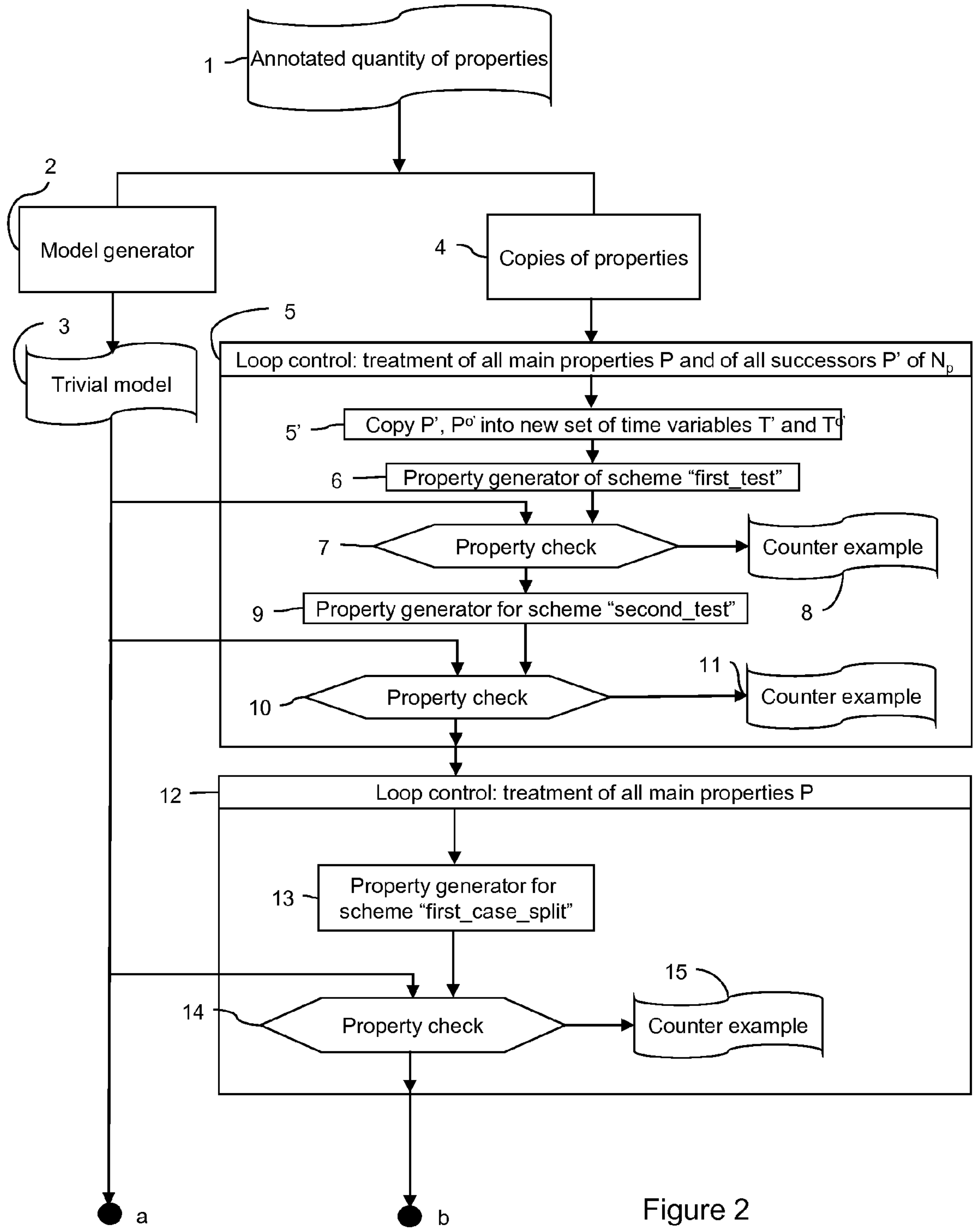
FIG. 2 depicts a procedure for checking completeness.
Figure 2:
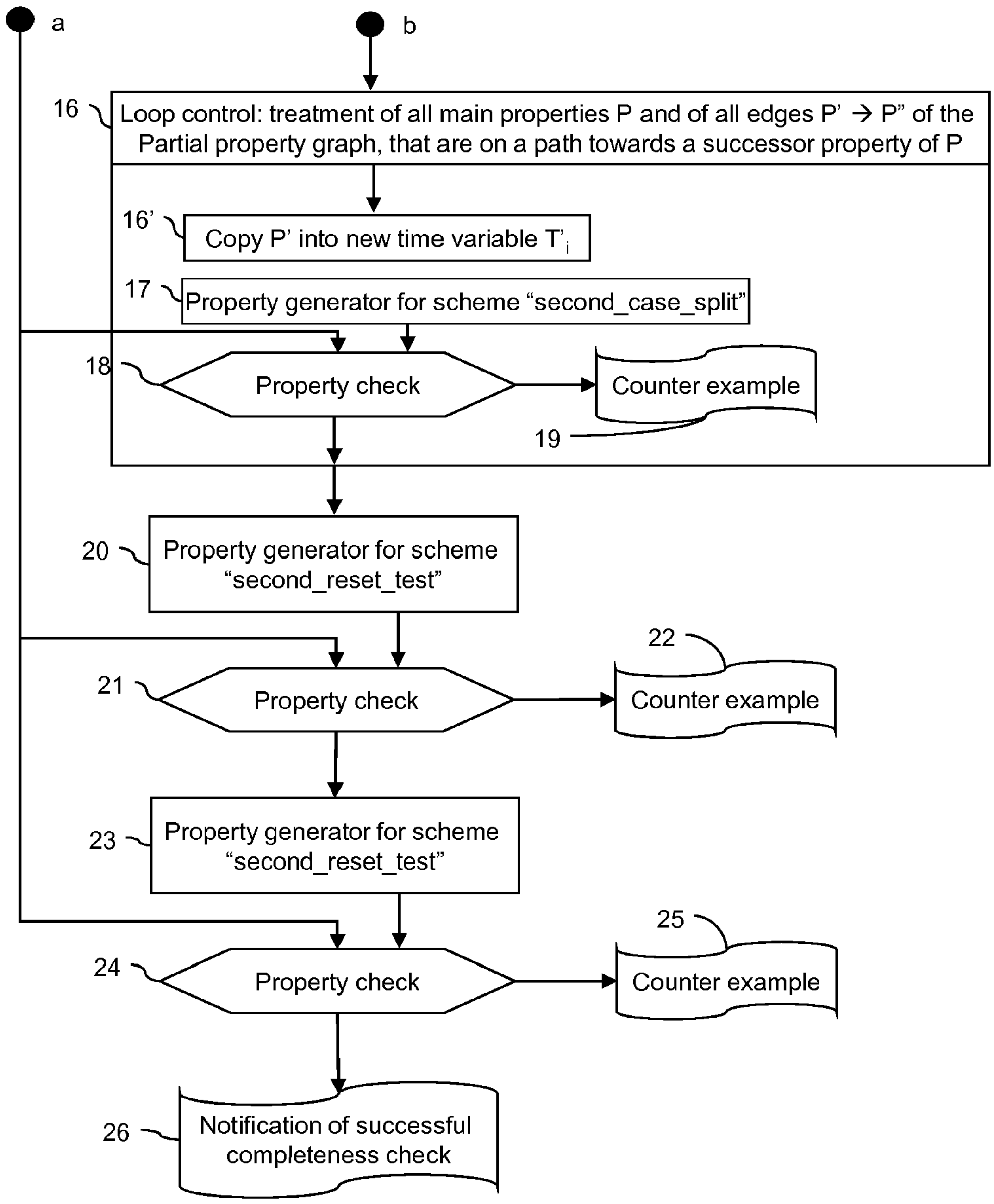
Figure 5:
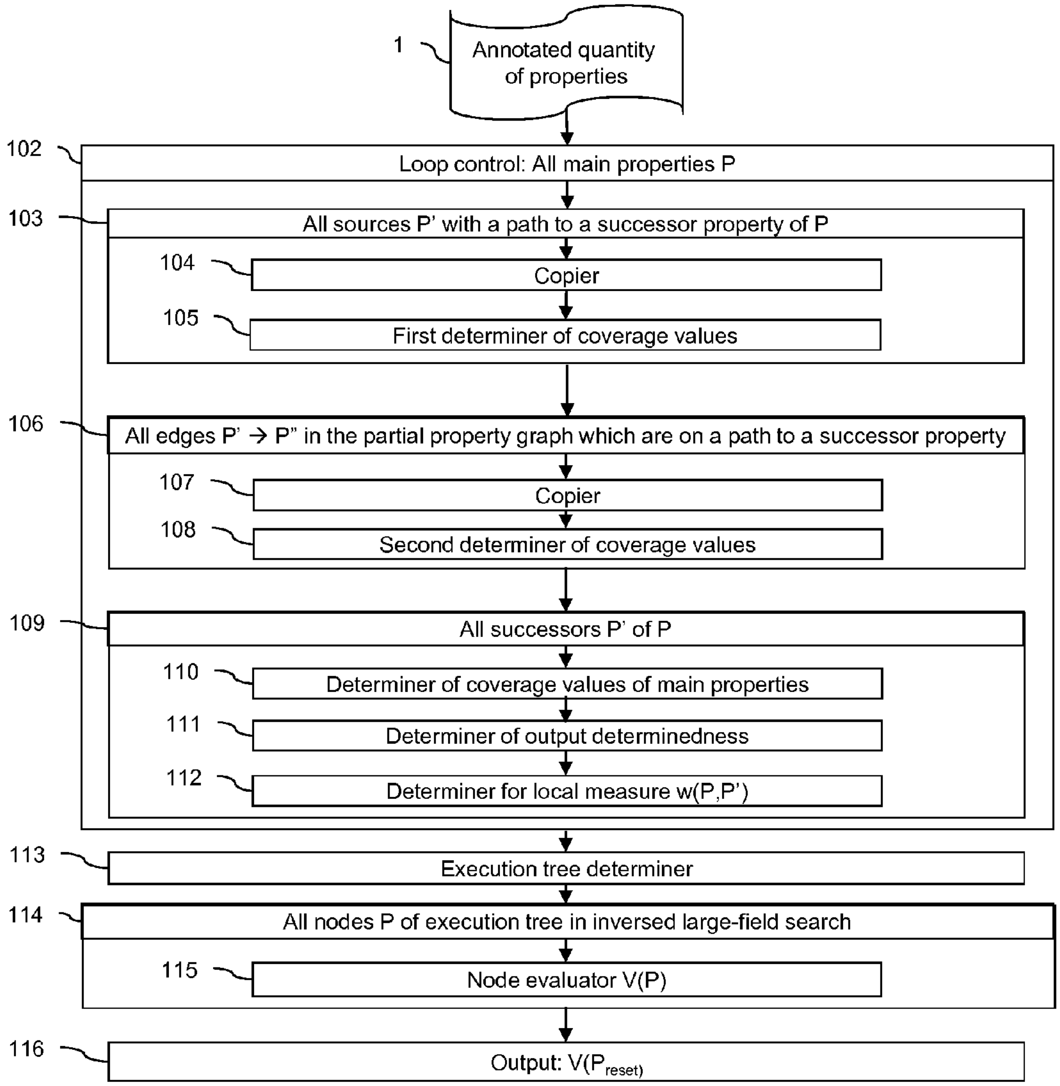
FIG. 5 depicts a procedure for determining a measure of completeness.

FIG. 5 provides an overview of the procedure of the four example of execution. The starting point is the annotated quantity of properties (1), for which all properties and their quantities of successors fulfil the consistency properties, which were generated from the property scheme first_test by means of steps (5) to (7) of FIG. 2 resp. by means of steps (5*a*) to (7*a*) of the machined determination of the quantity of successors and their reference points in time as per FIG. 4.

For the following representation, it is to be assumed that the assumptions of the main and partial properties are selected such that the individual lines $A'_i(Bel_{ij})$; $L'_{i1}(Bel_{ij})$; $L'_{i2}(Bel_{ij})$; . . . .

in the properties mutually exclude one another in accordance with the scheme first_case_split. That is, the conjunction for every two such lines is to be empty under the assumption issued by the scheme. Furthermore, the individual lines $A'_i(Bel_{ij})$; $L'_{i1}(Bel_{ij})$; $L'_{i2}(Bel_{ij})$; . . . .

in the properties are to mutually exclude one another in accordance with the scheme second_case_split. If this is not the case, a priority must be established among the properties involved, for example by means of numeration $P_1$, $P_2$, . . . of the properties. The requirement of the original property $P_n$ must then be replaced by

---

$A_n$ and
not($A_1$($Bel_{11}$) and $L_{11}$($Bel_{11}$) and $L_{12}$($Bel_{11}$) and ...) and
not($A_1$($Bel_{12}$) and $L_{11}$($Bel_{12}$) and $L_{12}$($Bel_{12}$) and ...) and
... and
not($A_2$($Bel_{21}$) and $L_{21}$($Bel_{21}$) and $L_{22}$($Bel_{21}$) and ...) and
not($A_2$($Bel_{22}$) and $L_{21}$($Bel_{22}$) and $L_{22}$($Bel_{22}$) and ...) and
... and
not ($A_{n-1}$($Bel_{n-1,1}$) and $L_{n-1,1}$($Bel_{n-1,1}$) and $L_{n-1,2}$($Bel_{n-1,1}$) and ...) and
not ($A_{n-1}$($Bel_{n-1,2}$) and $L_{n-1,2}$($Bel_{n-1,2}$) and $L_{n-2,2}$($Bel_{n-1,2}$) and ...) and
...

---

In the loop control (102) of FIG. 5, all main properties P are run. In the loop control (103), all sources P' of the partial property graph for P, from which paths to a successor property of P exist, are run.

In the copier (104), the temporal variables of P' are differentiated from those in P in the manner from the first part of the invention and subsequently designated with $T'_i$. At the same time, $T'_0$=R is set and the temporal variably is set to $T_0$ by t in P. In the first coverage value determiner (105), a coverage value w(P, P') is then assigned to the sequence from P and P' as follows:

Where

G=A and C and E and $L_1$ and $L_2$ and . . . .

the assumption corresponding to the scheme first_case_split. Where

H=G and A' and $L'_1$ and $L'_2$ and the condition for this that the property P' with its portions A', C', $L'_1$, $L'_2$ is utilized in a property corresponding to first_case_split. The coverage value for the sequence from P and P' is determined as $$w(P,P')=\mathrm{card}(H,H)/\mathrm{card}(G,H)$$

As a result, the loop (103) is completed via the sources P'.

The loop control (106) is to now run through every edge P'→P" in the partial property graph, which is located on a path to a successor property of P.

In the copier (107), the temporal values $T'_i$ of P' and $T''_i$ of P" are, on the one hand, differentiated from those in P and on the other, $T_0$=t, $T'_0$=R and $T'_i$=$T''_i$ is set for all temporal variables of P'.

Parallel to the above representation, the coverage value w(P', P") is determined in the second coverage value determiner (108) as follows:

Where:

G'=G and A' and $L'_1$ and $L'_2$ and . . . .

the assumption corresponding to the scheme second_case_split apply.

Where:

H'=G' and A" and $L''_1$ and $L''_2$ and . . .

the condition for this that the property P" with its portions A", C", $L''_1$, $L''_2$ is utilized in a property corresponding to second_case_split. Then, the coverage value w(P', P") is defined for $$w(P',P'')=\mathrm{card}(G',H')/\mathrm{card}(H',H')$$

In this way, the loop checked by the loop control (106) is abandoned.

The loop control (109) now runs through all main properties P', which are successors of P.

In the main property coverage determiner (110), the coverage value w(P, P') is determined as follows: Where $Q_0$, $Q_1$, $Q_2$, . . . $Q_n$ is the path from a source of the partial property graph up to the main property P'=$Q_n$. Afterwards, the following is calculated:

$$w(P,Q)=w(P,Q_0)*w(Q_0,Q_1)*w(Q_1,Q_2)* \ldots *w(Q_{n-1},P')$$

These individual factors are all known since w(P, $Q_0$) was calculated in the first coverage value determiner (105) and the remaining w($Q_i$, $Q_{i+1}$) in the second coverage value determiner (108).

In the output determinedness determiner (111), it is evaluated whether and how many of the lines

---

| | |
|---|---|
| during [$k_0$+1, $k'_0$]: | $o'_0 = o''_0$; |
| during [$k_1$+1, $k'_1$]: | $o'_1 = o''_1$; |
| ... | |

--- from the properties corresponding to the scheme second_test must be deleted in order to make the remaining property true. This is conducted in an iterative procedure, in which counter examples are automatically evaluated and lines violated by the counter example are deleted prior to the next application of the property checker. The output determinedness value w'(P, P') is determined as the quotient of the number of remaining lines opposite the number of all output signals.

Where u is a constant in the closed interval [0, 1] In the determiner for the local measurement (112), the local measurement is now determined by $$W(P,Q)=(u+(1-u)*w'(P,Q))*w(P,Q)$$

As a result, the inner loop (109) and the outer loop (102) end.

In the execution tree generator (113), the execution tree is now to be generated for the annotated set of properties (1).

Where v is a constant from the interval open on the right [0, 1[. The loop control (114) is to run through the nodes of the execution tree such that it starts with the end nodes and first processes an inner node once all successors have already been processed.

The node evaluator (115) now calculates a completeness value V(P) for every node P. If P is an empty end node, then $$V(P)=v$$

is set. If P is a full node, then $$V(P)=1$$

is set. In all other cases, P is an inner node. Then P has sons, which are designated with $Q_1$, $Q_2$, . . . $Q_n$. The following is calculated $$V(P)=v+(1-v)*(W(P,Q_1)*V(Q_1)+W(P,Q_2)*V(Q_2)+W(P,Q_3)*V(Q_3)+ \ldots )$$

As a result, the loop (114) is abandoned. The user receives the value V($P_{reset}$) as the resulting completeness measure displayed in the user output (116).

With the constants v and u, the completeness measure can be adjusted to the distribution of work among individual partial tasks during the course of the formal verification.

If u=0, then the output determinedness is reflected to a very high degree in the final result. If u=1, then no consideration is given to the output determinedness. In this way, u can be used in order to allow the portion of processing load based on experience for ensuring the output determinedness to flow into the determination of the completeness measure during the course of the verification and consequently to bring the measure calculated in contact with the anticipated work. In any case, W(P,Q)=w(P,Q) applies, if the tasks have been completely determined.

v=0 results in all nodes that are located on paths to empty end nodes being evaluated with 0. The completeness measure then accordingly remains at 0 as long as the transition graph of the property machine does not contain a loop. This is potentially an unwanted effect since properties have obviously already been described such that a value/=0 is suggested. However, since the closing of the loop is a time-consuming verification step based on experience, the completeness measure should remain small as long as the loops are not closed and therefore, v should also remain close to 0.

It is to be shown that the procedure has the following properties:

1. The completeness measure is 1, if the annotated quantity of properties (1) is complete.
2. If the annotated quantity of properties (1) is incomplete and the constant is u/=1, then the completeness measure is <1.
3. The completeness measure is monotonous, that is if a given incomplete set of properties is furthered by one property, the measure will not be reduced.

For the proof of 1), it is first shown that the validity of a property corresponding to the scheme first_case_split has the consequence that the following applies in the situation of the properties corresponding to the scheme first_case_split:

$$w(P,P'_1)+w(P,P'_2)+w(P,P'_3)+\ldots=1$$

For this, the $P'_i$ describe all sources of the partial property graph, from which a path leads to one of the properties from the quantity of successors.

In advance, some rules for calculating with card(A,B) are proven: Where H is any condition, V a finite quantity of variables, which is the upper quantity of sup(H) and W a finite quantity of variables disjoint to V. + is to designate the unification of quantities. Then $$\text{card}(H,V+W)=\text{card}(\text{def}(W))*\text{card}(H,V)$$

applies, if G is a second conditions with H=>G, the following correspondingly applies $$\text{card}(H,H)/\text{card}(G,H)=\text{card}(H,\text{sup}(H))/\text{card}(G,\text{sup}(H)) = \text{card}(H,V)/\text{card}(G,V)$$

for every upper quantity V of sup(H). As a result, the following applies to the values calculated in the coverage value determiner (5)

$$w(P,P')=\text{card}(H,V)/\text{card}(G,V)$$

for every upper quantity V of sup(H).

Where $H_1, H_2, H_3, \ldots$ are the conditions, which are formed in the first coverage value determiner (105) from $P'_1, P'_2, P'_3$. The quantity $$V=\text{sup}(H_1)+\text{sup}(H_2)+\text{sup}(H_3)+\ldots$$

(+ stands for the addition of quantities) is in any case an upper quantity of every $\text{sup}(H_i)$. Then, the above-mentioned can be used and one acquires $$\begin{aligned}&w(P,P'_1)+w(P,P'_2)+w(P,P'_3)+\ldots=\\&(\text{card}(H_1,V)+\text{card}(H_2,V)+\text{card}(H_3,V)+\ldots)/\text{card}(G,V)=\\&\text{card}(H_1\text{ or }H_2\text{ or }H_3\text{ or }\ldots,V)/\text{card}(G,V)\end{aligned}$$

The last reformulation is possible because it was assumed that the requirements of $P'_i$ are disjoint and therefore, the conjunction of any pairs of $H_i$ is empty. The following reformulation is therefore possible:

$$\begin{aligned}&\text{card}(H_1\text{ or }H_2\text{ or }H_3\text{ or }\ldots,V)/\text{card}(G,V)=\\&\text{card}(G\text{ and }((A'_1\text{ and }L'_{11}\text{ and }L'_{12}\text{ and }\ldots)\text{ or}\\&(A'_2\text{ and }L'_{21}\text{ and }L'_{22}\text{ and }\ldots)\text{ or}\\&(A'_3\text{ and }L'_{31}\text{ and }L'_{32}\text{ and }\ldots)\text{ or}\\&\ldots),V)/\text{card}(G,V)=\\&\text{card}(G,V)/\text{card}(G,V)=1\end{aligned}$$

The second last reformulation is valid because the validity of the property was required in accordance with scheme first_case_split.

In a similar manner, one can see that the following applies to a partial property P' and its sons $P''_1, P''_2, P''_3, \ldots$ in the partial property graph $$w(P',P''_1)+w(P',P''_2)+\ldots=1$$

For every main property P and any arbitrary node Q' in the partial property graph of P, s(P, Q') is to be the sum of all w(P, Q), whereupon Q runs through all successor properties of P, which are to be reached by means of a path from Q'. Where $Q_0, Q_1, \ldots Q_n$ is a path from a source to Q' and $Q_n$=Q'. This path is unambiguously/uniquely determined by means of the stipulations concerning the partial property graph. By means of the complete induction, it is proven that $$s(P,Q')=w(P,Q_0)*w(Q_0,Q_1)*w(Q_1,Q_2)*\ldots*w(Q_{n-1},Q')$$

Embedding of induction: The claim is trivial if a sink of the partial property graph for Q' is selected because the sinks indeed represent the main properties.

Inductive step: The induction is to run through the node of the sinks up to the source in the breadth-first search such that the claim already applies to all successors $R_1, R_2, \ldots$ of Q' in the partial property graph for determining s(P, Q'). First of all, all paths lead through P and Q' to main properties, which are located in the quantity of successors of P, due to the requests of the partial property graph. As a result, the following applies $$\begin{aligned}&s(P,Q')=s(P,R_1)+s(P,R_2)+\ldots=\\&w(P,Q_0)*w(Q_0,Q_1)*\ldots*w(Q_{n-1},Q')*w(Q',R_1)+\\&w(P,Q_0)*w(Q_0,Q_1)*\ldots*w(Q_{n-1},Q')*w(Q',R_2)+\\&w(P,Q_0)*w(Q_0,Q_1)*\ldots*w(Q_{n-1},Q')*w(Q',R_3)+\\&\ldots=\\&w(P,Q_0)*w(Q_0,Q_1)*\ldots*w(Q_{n-1},Q')*(w(Q',R_1)+w(Q',R_2)+\ldots)\end{aligned}$$

The contents of the brackets in the last line were proven to result for 1 further up. Therefore the following applies $$s(P,Q')=w(P,Q_0)*w(Q_0,Q_1)*\ldots*w(Q_{n-1},Q')$$

With this, the inductive claim is proven.

The main properties are designated with $P_1, P_2, \ldots$ from the quantity of successors of P.

Furthermore, the sources of the partial property graph, from which paths lead to properties from the quantity of successors of P, are designated with $Q_1, Q_2, Q_3, \ldots$.

The above consideration has demonstrated that $$\begin{aligned}&w(P,P_1)+w(P,P_2)+w(P,P_3)+\ldots=\\&s(P,Q_1)+s(P,Q_2)+s(P,Q_3)+\ldots=\\&w(P,Q_1)+w(P,Q_2)+w(P,Q_3)+\ldots\end{aligned}$$

This value is equal to 1 as per the above considerations.

It will now be shown that V(P)=1 is valid for every node P in the execution tree of a complete quantity of properties. This is demonstrated by means of complete induction via the execution tree:

Embedding of induction: There is no property without successors in a complete quantity of properties. As a result, every end node is full and therefore, the inductive claim applies to all end nodes.

Inductive step: The induction is to traverse all nodes in the reversed breadth-first search, that is a node P is first selected, when the inductive assumption has already been proven for its sons $Q_1$, $Q_2$, . . . . Then the following applies $$V(P) = v + (1-v) * (W(P, Q_1) * V(Q_1) + W(P, Q_2) * V(Q_2) + W(P, Q_3) * V(Q_3) + \ldots) = v + (1-v) * (W(P, Q_1) + W(P, Q_2) + W(P, Q_3) + \ldots)$$

Under the assumption that the quantity of properties is complete, all output signals have also all been tested by means of the property second_test. As a result, W(P, Q)=w(P, Q) applies and consequently $$V(P)=v+(1-v)*(w(P,Q_1)+w(P,Q_2)+\ldots)$$

The sum in the brackets is 1 due to the considerations above, therefore $$V(P)=v+1-v=1$$

As a result, the inductive claim is proven. For this, it also particularly applies that $V(P_{reset})=1$ and 1 is equal to the completeness measure.

Where $M_1$ and $M_2$ are an annotated quantity of properties and $M_1$ a sub-quantity of $M_2$. The properties also contained from $M_2$ should not have any contradictory assumptions. The consistency conditions concerning the quantities of successors require of $M_2$, that the execution tree of $M_2$ then also contains the addition properties. Furthermore, v/=1, v/=0 and u/=0 apply.

The execution tree of $M_1$ is a sub-tree of $M_2$. First of all, it is demonstrated that the following applies to every node P of the execution tree of $M_1$ and to the relation between the evaluations $V_1$ and $V_2$ for $M_1$ resp. $M_2$:

$$V_1(P)<=V_2(P)$$

and even $V_1(P)<V_2(P)$, in the event the partial tree of the execution tree beginning in P contains properties, which arise in $M_2$, but not in $M_1$.

The proof is conducted again by means of induction. This follows a reversed breadth-first search.

Embedding of Induction:

If P is a full end node in $M_1$, then it is also a full end node in $M_2$. Therefore, the inductive claim applies.

If P is an empty end node in $M_1$, then it can be an inner node in $M_2$. If it is an inner node, then the following applies:

$$V_1(P)<V_2(P)$$

This results from the definition of $V_1$ resp. $V_2$, from v<1, from V(P)>0 for every node and from W(P, Q)>0 because u/=0 was required. This corresponds to the inductive claim.

If P is an empty end node in $M_1$ and not an inner node in $M_2$, then it is also an empty end node in $M_2$ such that the inductive claim once again applies.

Induction:

In a reversed breadth-first search, the execution tree is once again traversed. An inner node P in the execution tree of $M_1$ is to be observed. It is to have the sons $Q_1$, $Q_2$, . . . , to which the inductive claim applies. If the partial trees of the two execution trees beginning with $Q_i$ are equal, then $V_1(Q_i)=V_2(Q_i)$ applies for all i. As a result, $V_1(P)=V_2(P)$ also applies because the same numbers are inserted in the definition.

In all other cases, there is at least one Q among $Q_i$ with various partial trees and therefore $V_1(Q)<V_2(Q)$. If these numbers are inserted in the definitions of $V_1(P)$ and $V_2(P)$, the following is returned as a result $$V_1(P)<V_2(P)$$

because multiplication is conducted using positive numbers. As a result, the inductive claim is also demonstrated for the inductive step.

As a consequence thereof, the following applies $$V_1(P_{reset})<V_2(P_{reset}).$$

Measure for an Incomplete Quantity of Properties

An incomplete, annotated quantity of properties is to be given. As a result, it can be furthered by at least one property, which is disjoint to all the other ones. This proof shows that the furthered quantity of properties has a significantly larger completeness measure than the original quantity of properties. At the same time, the completeness measure is limited to a maximum of 1 as shown by the first part of the proof. Thus, the completeness measure of an incomplete quantity of properties is less than 1.

Application Example of the Fourth Example of Execution

Reference will be made to the interrupt controller corresponding to the application example for the first example of execution and one observes an incomplete quantity of properties, which consist of the properties reset, wm and idle. All output descriptions should be precise. The quantities of successors are to be correspondingly reduced by int; in the partial property graph, int_op appears and int does not appear. v=0.1 is to be given.

The graph of the resulting property machine is provided in FIG. 7; the execution tree for it in FIG. 8. The coverage values occur as follows:

```
w(reset, wm):
G_reset =
(reset @ t = '1' and reset @ t+1 = '0' and
int__req @ t = '0' and int__req @ t+1 = '0' and
d__out @ t = "00" and d__out @ t+1 = "00" and
mask @ t+1 = "FF" and
pending__int @ t+1 = "00" and
state @ t+1 = idle and
reset @ t+1 = '1' and reset @ t+2 = '1' and
e1 @ t+1 and e1 and t+2);
H_reset, wm =    (G_reset and
reset @ t+1 = '0' and reset @ t+2 = '0' and
state @ t+1 = idle and
write__mask @ t+1 = '1')
=    (G_reset and
write__mask @ t+1 = '1');
```

Conjuncts, which already occur in $G_{reset}$, were omitted for the last reformulation. For the following reformulation, some rules concerning card arising from: A and B are two conditions, V an upper quantity of sup(A), W an upper quantity of sup(B) and V and W are utilized disjoint to one another. Then card(A and B, V+W)=card(A, V)*card(B, W). If A and B are two conditions and V an upper quantity of sup(A+B), then card(A or B, V)=card(A, V)+card(B and not A, V) applies.

The elements of sup(H) can be easily read from the above representation. sup(G) does not contain write_mask @ t+1 such that

```
w(reset, wm) = card(H, H) / card(G, H) =
card(write_mask@t+1 = '1', {write_mask@t+1}) /
card(true,{write_mask@t+1})
= 0.5
w(reset, idle): It is
H_reset, idle = (G_reset and
reset @ t+1 = '0' and reset @ t+2 = '0' and
state @ t+1 = idle and
write_mask @ t+1 = '0' and
(pending_int @ t+1 and mask @ t+1) = 0)
= (G_reset and
write_mask @ t+1 = '0')
```

Parallel to above, the following therefore results $w$(reset,idle)=0.5 w(reset, idle) and w(reset, wm) supplementing one another for 1 complies with the validity of the property corresponding to first_case_split.

```
w(wm, wm):
G_wm =
(reset @ t = '0' and reset @ t + 1 = '0' and
state @ t = idle and
write_mask @ t = '1' and
int_req @ t+1 = '0' and
mask @ t+1 = d_in @ t and
state @ t+1 = idle and
pending_int @ t+1 = (pending_int @ t or int_in @ t) and
d_out @ t+1 = "00" and
reset @ t+1 = '0' and reset @ t+2 = '0' and
e_1 @ t+2 and e_1 @ t+3 and e_1 @ t+4 and .... and e_1 @ t+12);
H_wm, wm = (G_wm and
reset @ t+1 = '0' and reset @ t+2 = '0' and
state @ t+1 = idle and
write_mask @ t+1 = '1')
= (G_wm and
write_mask @ t+1 = '1')
Therefore
w(wm, wm) = 0.5
w(wm, idle):
H_wm,idle = (G_wm and
reset @ t+1 = '0' and reset @ t+2 = '0' and
state @ t+1 = idle and
write_mask @ t+1 = '0' and
(pending_int @ t+1 and mask @ t+1) = 0)
= (G_wm and
write_mask = '0' and
((pending_int @ t or int_req @ t) and d_in @ t = 0)) apply
```

Where $G'_{wm}$ is defined as $G_{wm}$, whereupon however the line via pending_int is skipped. Then the following applies:

```
H_wm,idle = (G'_wm and
pending_int @ t+1 = (pending_int @ t or int_in @ t) and
((pending_int @ t or int_req @ t) and d_in @ t = 0) and
write_mask @ t+1 = '0');
```

With g=(pending_int @ t+1=(pending_int @ t or int_in @ t) and
((pending_int @ t or int_req @ t) and d_in @ t=0)) applying

```
w(wm, idle) = card(H_wm,idle, H_wm, idle) / card(G_wm, H_wm,idle) =
(card(G'_wm, G'_wm) * card(g, g) *
card(write_mask @ t+1 = '0', {write_mask @ t+1)}) /
(card(G'_wm, G'_wm) *
card(pending_int @ t+1 = (pending_int @ t or int_in @ t), g) *
```

-continued

```
card(1, {write_mask @ t+1)}) =
0.5 * card(g, g) / card(pending_int @ t+1 = (pending_int @ t or
int_in @ t), g)
```

First of all, card(pending_int @ t+1=(pending_int @ t or int_in @ t), g)=2**32 applies since from the five 8-bit signals in sup(g), all of them except of pending_int @ t+1 can be freely selected and for each selection, there is a directly corresponding pending_int @ t+1.

For the determining of card(g,g), a case differentiation is conducted concerning number of zeros in d_in@t. For each one there are several 8!/((8−n)!*n!) possibilities to generate a bit array with n zeros. At the positions of these zeros, ones may occur in pending_int @ t and in int_req @ t, all other positions must be 0. For every variable, there are 2n possibilities for filling the allowed positions with 0 or 1. Therefore, there are (8!22n)/((8−n)!*n!) possibilities of occupying these three variables such that on the one hand, d_in @ t contains exactly n zeros and on the other hand, ((pending_int @ t or int_req @ t) and d_in @ t=0) applies. The sum concerning this expression for n=0, 1, . . . 8 returns 390625. For every combination, int_in@t can be freely selected and then there is only exactly one suitable pending_int t+1. Thus, the following applies

```
w(wm, idle) = 0.5 * 390625 / 2 ** 24 = 0.0116415.
w(idle, wm):
G_idle =
reset @ t = '0' and reset @ t + 1 = '0' and
state @ t = idle and
write_mask @ t = '0' and
(pending_int @ t and mask @ t) = 0 and
state @ t+1 = idle and
mask @ t+1 = mask @ t and
int_req @ t+1 = '0' and
pending_int @ t+1 = (pending_int @ t or int_in @ t) and
d_out @ t+1 = "00" and
reset @ t+1 = '0' and reset @ t+2 = '0' and
e_1 @ t+2 and e_1 @ t+3 and e_1 @ t+4 and .... and e_1 @ t+12;
H_idle, wm = G_idle and
reset @ t+1 = '0' and reset @ t+2 = '0' and
state @ t+1 = idle and
write_mask @ t+1 = '1'
= G_wm and
write_mask @ t+1 = '1'
Therefore, the following applies
w(idle, wm) = 0.5
w(idle, idle)
H idle, idle = G_idle and
reset @ t+1 = '0' and reset @ t+2 = '0' and
state @ t+1 = idle and
write_mask @ t+1 = '0' and
(pending_int @ t+1 and mask @ t+1) = 0
= G_idle and
write_mask @ t+1 = '0' and
((pending_int @ t or int_in @ t) and mask @ t) = 0
= G_idle and
write_mask @ t+1 = '0' and
(int_in @ t and mask @ t) = 0
Assume
G'_idle =
reset @ t = '0' and reset @ t + 1 = '0' and
state @ t = idle and
write_mask @ t = '0' and
state @ t+1 = idle and
int_req @ t+1 = '0' and
d_out @ t+1 = "00" and
reset @ t+1 = '0' and reset @ t+2 = '0' and
e_1 @ t+2 and e_1 @ t+3 and e1 @ t+4 and .... and e_1 @ t+12;
```

-continued

```
With the shortcut
        g'   = (pending__int @ t and mask @ t) = 0 and
        mask @ t+1 = mask @ t and
        pending__int @ t+1 = (pending__int @ t or int__in @ t)
and
        g = g' and (int__in @ t and mask @ t) = 0
one comes to
        w(idle, idle) = card(Hidle, idle, Hidle, idle) /
        card(Gidle, Hidle, idle) =
        ((card(G'idle, G'idle) * card(g, g) *
        card(write__mask @ t+1 = '0', {write__mask @ t+1})) /
        ((card(G'idle, G'idle) * card(g', g) *
        card(true, {write__mask @ t+1}))
        =       0.5 * card(g, g) / card(g', g)
```

card(g', g) is calculated as following: Based on assumptions similar to those above it follows that there are 6561 possibilities of fulfilling (pending_int @ t and mask @ t)=0. For each of these possibilities, int_in can be selected freely and it then returns exactly one mask @ t+1 respectively pending_int @ t+1, which can be suitably selected for it. Consequently card(g', g)=1679616 applies.

For the calculation of card(g, g), it can be concluded as above that there are 390625 possibilities of selecting int_in t, pending_int@t and mask@t. From this selection, mask @ t+1 und pending_int @ t+1 clearly result. As a result, the following applies $$w(\text{idle},\text{idle})=0.5*390625/1679616=0.116284$$

The completeness values of the nodes now result as in FIG. 8. The completeness value is calculated to 0.5561781

Extensions of the two to four examples of execution:

Coverage Value Calculation

The coverage values can be calculated according to various algorithms. A conceivable alternative algorithm approximates it by generating random values, which fulfil G and it is checked as to how many of these random values fulfil the assumptions of the possible successor properties.

Determining Output Determinedness

One can skip to more general determinedness criteria. Furthermore, the criteria for determining the value w'(P, Q) can be selected in a considerable number of ways: One procedure sets w'(P,Q)=u as soon as the property has not been fulfilled according to the scheme second_test and is equal to 1 in all other cases. This completely abstains from iterations. On the other extreme, the determinedness of a signal is checked separately at every point in time.

Reduced Assumptions Concerning the Predecessor Property

As in the first example of execution, one can skip to simplified assumptions concerning the predecessor property. This has the advantage that, under certain circumstances, several properties produce the same reduced assumptions and in this manner, the calculations can be shortened.

The invention is not limited to the temporal logic described. It can be transferred to all linear temporal logics, that is, particularly to the standards PSL and SVA. Finally, it is crucial that the properties no longer enable a structured application on a singular basis, but rather in terms of forming chains.

The invention claimed is:

1. A computer-implemented method of functional verification of a digital circuit, wherein the digital circuit is checked with a set of properties representing a functioning of the digital circuit, wherein a quality factor of the set of properties has a predetermined value and wherein the properties determine a value series of internal values and output values for an input pattern, the input pattern comprising a temporal sequence of values of input values and an initial value of its internal values, the method comprising:

a) Determining an existence of at least one subset of interrelated properties ($P_0, P_1, \ldots P_n$);

b) Checking by a computer whether a value of a predetermined expression Q(t) is uniquely determined for at least one input pattern at at least one time point by means of an interaction of the least one subset of interrelated properties, whereby at said time point the value of the predetermined expression Q(t) is not uniquely determined by individual ones of the properties and wherein the predetermined expression is only dependent on values of the input values and the output values and the output values at time points; and c) Outputting by a computer the quality factor based on said Q(t).

2. A computer-implemented generation method for a specification of a digital circuit having a set of properties representing a functioning of the digital circuit, wherein a quality factor of the set of properties has a predetermined value and wherein the properties determine a value series of internal values and output values for an input pattern, the input pattern comprising a temporal sequence of values of input values and an initial value of its internal values, the method comprising:

a) Determining an existence of at least one subset of interrelated properties ($P_0, P_1, \ldots P_n$);

b) Checking by a computer whether a value of a predetermined expression Q(t) is uniquely determined for at least one input pattern at least one time point by means of an interaction of the least one subset of interrelated properties, whereby at said time point the value of the predetermined expression Q(t) is not uniquely determined by individual ones of the properties and wherein the predetermined expression is only dependent on values of the input values and the output values and the output values at time points; and c) Outputting by a computer the quality factor based on said Q(t).

3. A computer-implemented simulation-based verification method of a digital circuit utilizing monitors, wherein a quality of the monitors is determined using a quality factor of a set of properties representing a functioning of the monitors, and wherein the properties determine a value series of internal values and output values for an input pattern, the input pattern comprising a temporal sequence of values of input values and an initial value of its internal values, the method comprising:

a) Determining an existence of at least one subset of interrelated properties ($P_0, P_1, \ldots P_n$);

b) Checking by a computer whether a value of a predetermined expression Q(t) is uniquely determined for at least one input pattern at least one time point by means of an interaction of the least one subset of interrelated properties, whereby at said time point the value of the predetermined expression Q(t) is not uniquely determined by individual ones of the properties and wherein the predetermined expression is only dependent on values of the input values and the output values and the output values at time points; and c) Outputting by a computer the quality factor based on said Q(t).

4. A computer-implemented simulation-based verification method of a digital circuit, wherein a coverage of the simulation-based verification is determined by set of monitors, wherein the set of monitors is defined based on a set of properties whose quality factor corresponds to a predetermined value and wherein the properties determine a value series of internal values and output values for an input pattern, the input pattern comprising a temporal sequence of values of input values and an initial value of its internal values, the method comprising:

a) Determining an existence of at least one subset of interrelated properties ($P_0$, $P_1$, . . . $P_n$);

b) Checking by a computer whether a value of a predetermined expression Q(t) is uniquely determined for at least one input pattern at least one time point by means of an interaction of the least one subset of interrelated properties, whereby at said time point the value of the predetermined expression Q(t) is not uniquely determined by the individual properties and wherein the predetermined expression is only dependent on values of the input values and the output values and the output values at time points; and c) Outputting by a computer the quality factor based on said Q(t).

* * * * *